United States Patent
Miyazaki et al.

(10) Patent No.: US 10,534,054 B2
(45) Date of Patent: Jan. 14, 2020

(54) MAGNETIC RESONANCE IMAGING APPARATUS AND MAGNETIC RESONANCE IMAGING METHOD

(71) Applicant: Toshiba Medical Systems Corporation, Otawara-shi (JP)

(72) Inventors: Mitsue Miyazaki, Des Plaines, IL (US); Xiangzhi Zhou, Vernon Hills, IL (US)

(73) Assignee: Canon Medical Systems Corporation, Otawara-shi (JP)

(*) Notice: Subject to any disclaimer, the term of this patent is extended or adjusted under 35 U.S.C. 154(b) by 422 days.

(21) Appl. No.: 15/081,009

(22) Filed: Mar. 25, 2016

(65) Prior Publication Data
US 2017/0192070 A1    Jul. 6, 2017

Related U.S. Application Data

(60) Provisional application No. 62/274,630, filed on Jan. 4, 2016.

(51) Int. Cl.
*G01R 33/56* (2006.01)
*G01R 33/485* (2006.01)
*G01R 33/483* (2006.01)

(52) U.S. Cl.
CPC ....... *G01R 33/485* (2013.01); *G01R 33/4835* (2013.01)

(58) Field of Classification Search
CPC ............. G01R 33/5605; G01R 33/50; G01R 33/4828; A61B 5/055; A61B 2090/374
See application file for complete search history.

(56) References Cited

U.S. PATENT DOCUMENTS

| | | | |
|---|---|---|---|
| 2005/0033151 A1* | 2/2005 | Wu | G01R 33/50 600/410 |
| 2008/0200799 A1 | 8/2008 | Willard et al. | |
| 2012/0001632 A1* | 1/2012 | Umeda | G01R 33/4828 324/309 |
| 2014/0121495 A1* | 5/2014 | Dempsey | A61N 5/1064 600/411 |
| 2014/0154185 A1* | 6/2014 | Van Zijl | A61B 5/055 424/9.35 |
| 2015/0077110 A1 | 3/2015 | Miyoshi | |

FOREIGN PATENT DOCUMENTS

JP   2008-538972 A   11/2008
JP   2015-58145 A    3/2015

* cited by examiner

*Primary Examiner* — Alesa Allgood
(74) *Attorney, Agent, or Firm* — Oblon, McClelland, Maier & Neustadt, L.L.P.

(57) ABSTRACT

A magnetic resonance imaging apparatus according to an embodiment includes sequence control circuitry. The sequence control circuitry applies an MT (Magnetization Transfer) pulse over a plurality of slices under a gradient magnetic field and configured to apply, for each of the plurality of slices to which the MT pulse is applied, an RF pulse having a frequency corresponding to a resonance frequency of certain protons in each of the plurality of slices.

6 Claims, 17 Drawing Sheets

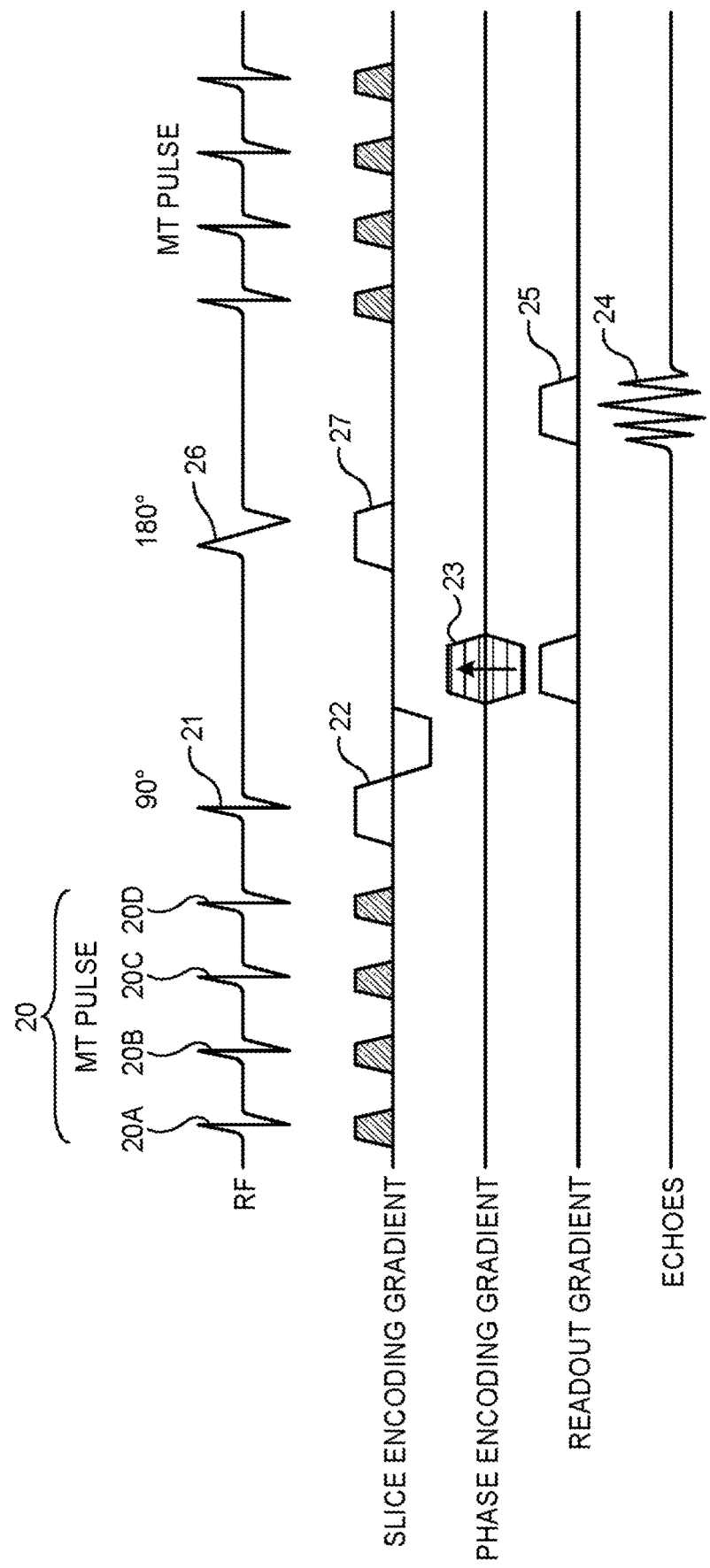

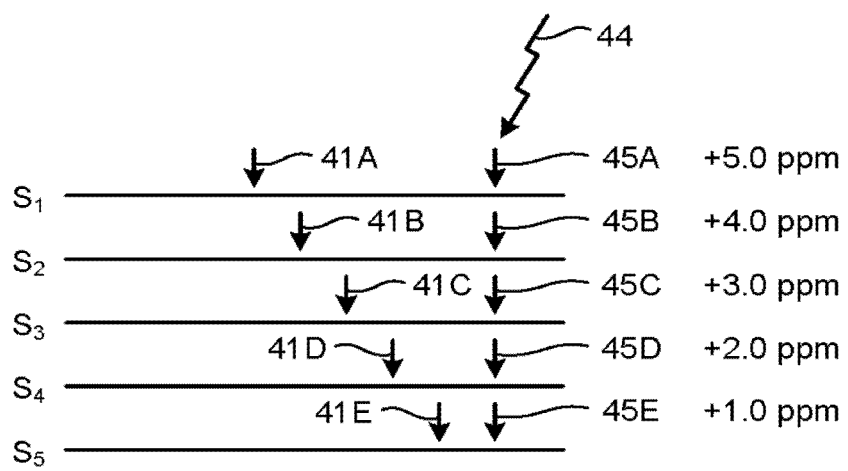
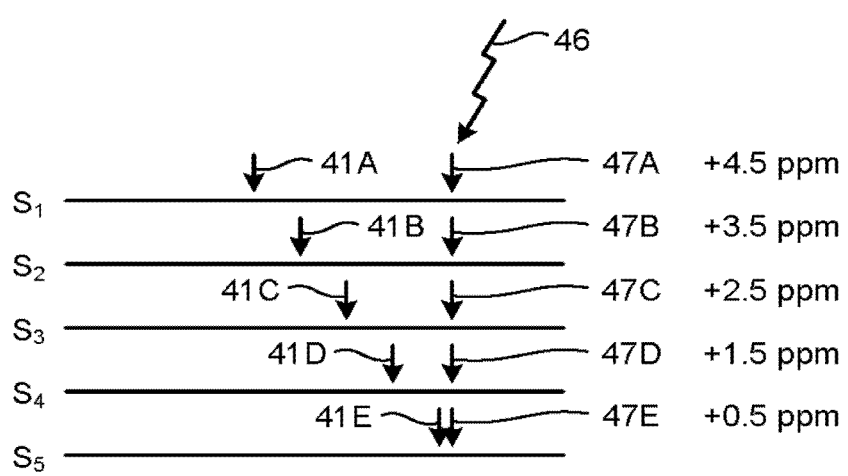

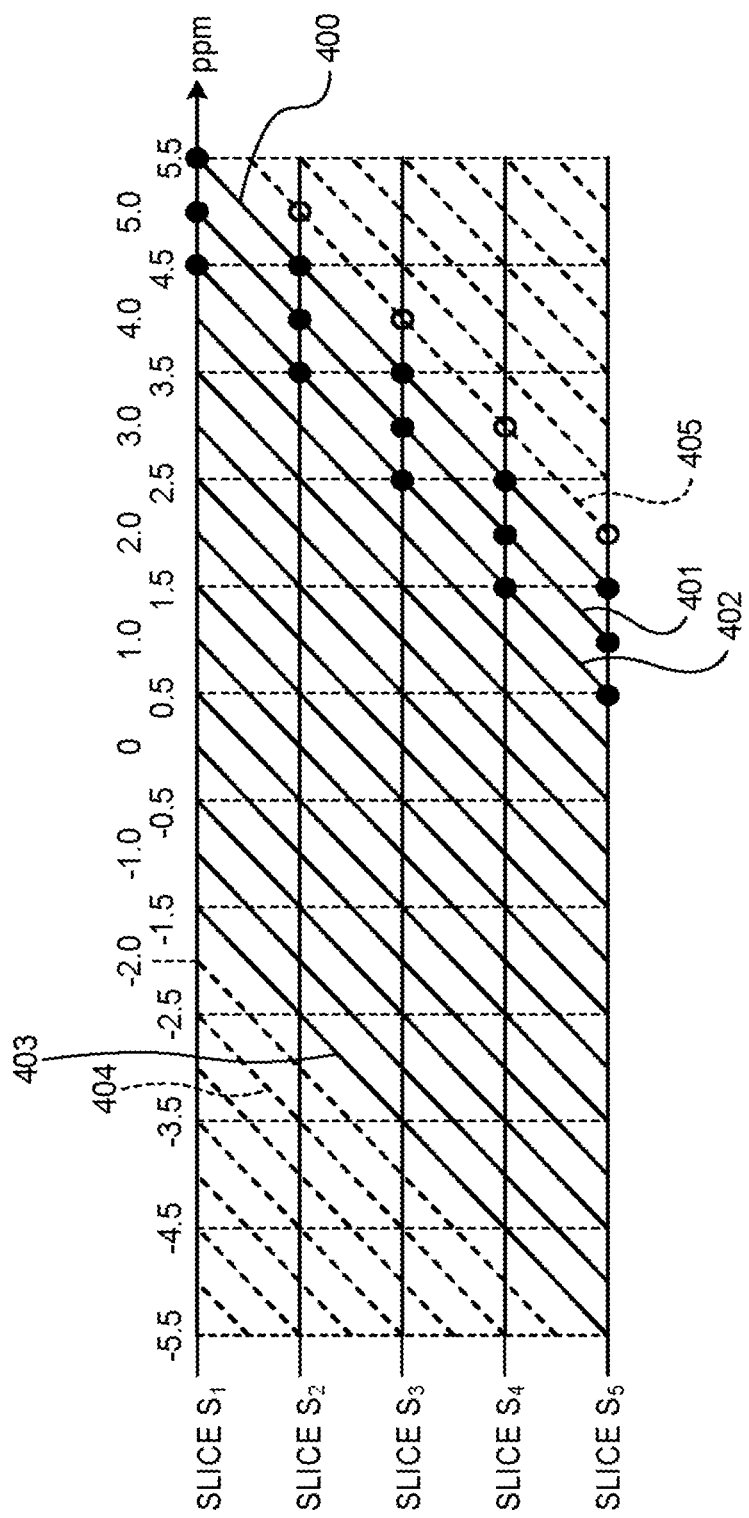

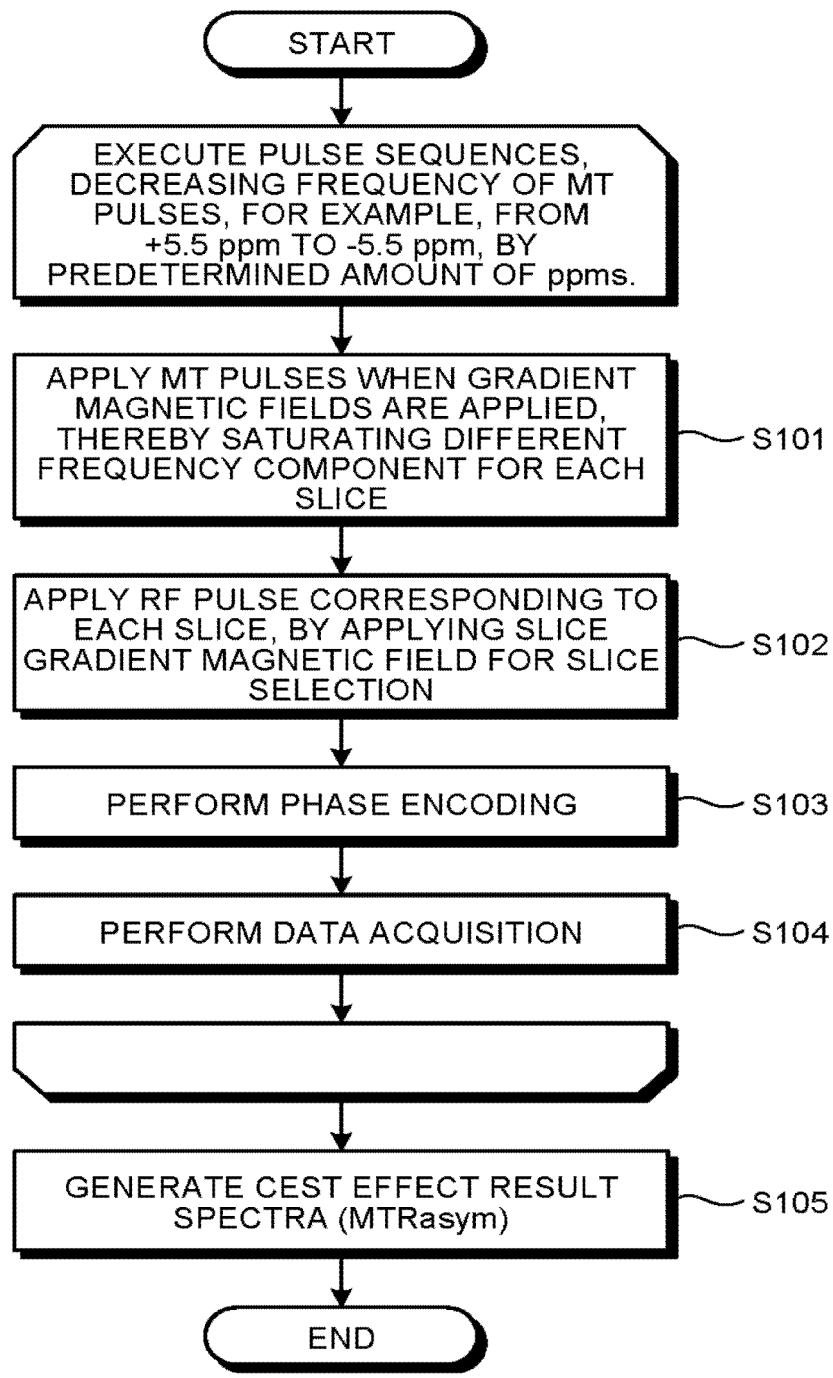

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from U.S. Provisional Application No. 62/274,630, filed on Jan. 4, 2016; the entire contents of all of which are incorporated herein by reference.

FIELD

Embodiments described herein relate generally to a magnetic resonance imaging apparatus and a magnetic resonance imaging method.

BACKGROUND

In magnetic resonance imaging, a method using the CEST (Chemical Exchange Saturation Transfer) effect is known. In this method, MT (Magnetization Transfer) pulses corresponding to the resonance frequency of non-free protons (protons other than the free water protons) are applied as saturation pulses. Subsequently, an RF (Radio Frequency) pulse corresponding to the resonance frequency of free water protons is then applied. Subsequently, signals of the free water protons are acquired when a predetermined time has passed. Thus, data corresponding to the magnetization transfer from the non-free protons (the protons other than the free water protons) to the free water protons is acquired.

However, this pulse sequence (CEST scan) is time-consuming in general when it comes to imaging.

BRIEF DESCRIPTION OF THE DRAWINGS

FIG. 2, FIG. 3A and FIG. 3B are drawings of explaining of processing performed by a magnetic resonance imaging apparatus according to a first embodiment;

FIG. 5A, FIG. 5B, FIG. 5C, FIG. 5D, FIG. 5E, FIG. 5F and FIG. 5G are drawings for explaining a magnetic resonance imaging apparatus according to the first embodiment;

FIG. 6 is a flowchart of explaining procedure of processing performed by a magnetic resonance imaging apparatus according to the first embodiment;

DETAILED DESCRIPTION

A magnetic resonance imaging apparatus according to an embodiment includes sequence control circuitry. The sequence control circuitry applies an MT (Magnetization Transfer) pulse over a plurality of slices under a gradient magnetic field and configured to apply, for each of the plurality of slices to which the MT pulse is applied, an RF pulse having a frequency corresponding to a resonance frequency of certain protons in each of the plurality of slices.

Exemplary embodiments of a magnetic resonance imaging apparatus and a magnetic resonance imaging method will be explained below with reference to accompanying drawings. Possible embodiments are not limited to exemplary embodiments described below. In principle, the description of each exemplary embodiment is applicable to any other embodiment as well.

First Embodiment

Figure 1:
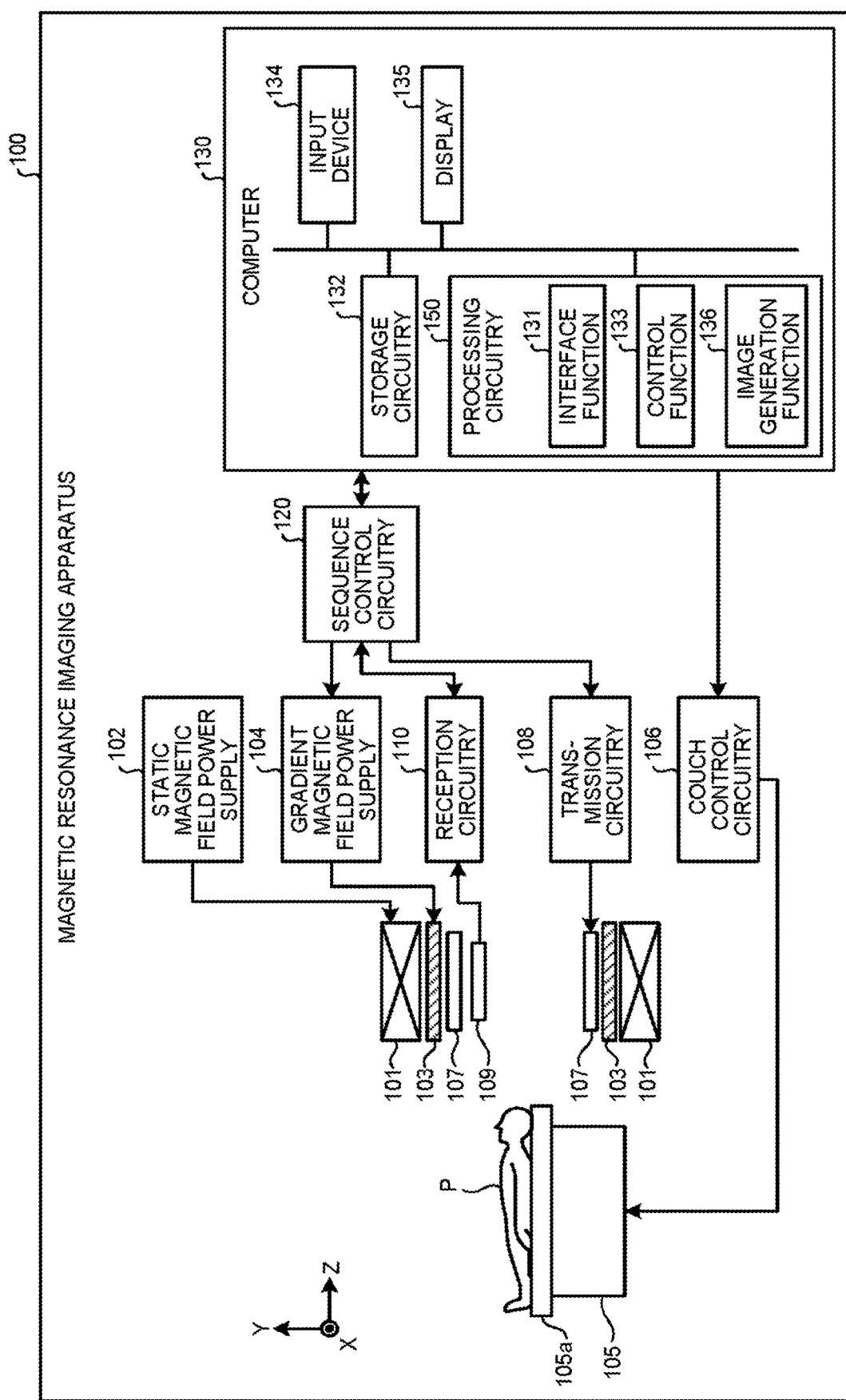
FIG. 1 is a block diagram illustrating a magnetic resonance imaging apparatus according to a first embodiment.

FIG. 1 is a block diagram of a magnetic resonance imaging apparatus 100 according to a first embodiment. As illustrated in FIG. 1, the magnetic resonance imaging apparatus 100 includes a static magnetic field magnet 101, a static magnetic field power supply 102, a gradient coil 103, a gradient magnetic field power supply 104, a couch 105, couch control circuitry 106, a transmission coil 107, transmission circuitry 108, a reception coil 109, reception circuitry 110, sequence control circuitry 120, and a computer 130 (which may be called an "image processing apparatus"). The magnetic resonance imaging apparatus 100 does not include an examined subject (such as a human body) P. The configuration illustrated in FIG. 1 is merely an example. In another example, any of the unit included in the sequence control circuitry 120 and the computer 130 may be integrated together or separated, as appropriate.

The static magnetic field magnet 101 is a magnet formed in the shape of a substantially hollow circular cylinder and generates a static magnetic field in a space on an inside thereof. The static magnetic field magnet 101 may be configured by using, for example, a superconducting magnet and is magnetically excited by receiving supply of electric current from the static magnetic field power supply 102. The static magnetic field power supply 102 supplies electric current to the static magnetic field magnet 101. Alternatively, the static magnetic field magnet 101 may be a permanent magnet, in which case the magnetic resonance imaging apparatus 100 need not comprise the static magnetic field power supply 102. Further, the static magnetic field power supply 102 may be provided separately from the magnetic resonance imaging apparatus 100.

The gradient coil 103 is a coil formed in a shape of a substantially hollow circular cylinder and is disposed on an inside of the static magnetic field magnet 101. The gradient coil 103 is formed by combining three coils corresponding to X-, Y-, and Z-axes that are orthogonal to one another. These three coils individually receive supply of electric current from the gradient magnetic field power supply 104 and generate gradient magnetic fields of which the magnetic field intensities change along the X-, Y-, and Z-axes. The gradient magnetic fields on the X-, Y-, and Z-axes that are generated by the gradient coil 103 correspond to, for example, a slice encode gradient magnetic field Gs, a phase encode gradient magnetic field Ge, and a readout gradient magnetic field Gr, respectively. The gradient magnetic field power supply 104 supplies the electric current to the gradient coil 103.

The couch 105 includes a couchtop 105a on which the subject P is placed. Under control of the couch control circuitry 106, while the subject P is placed thereon, the couchtop 105a is inserted into a hollow (i.e., an image taking opening) of the gradient coil 103. Normally, the couch 105 is provided so that a longitudinal direction thereof extends parallel to a central axis of the static magnetic field magnet 101. Under control of the computer 130, the couch control circuitry 106 drives the couch 105 so that the couchtop 105a moves in longitudinal directions and in up-and-down directions.

The transmission coil 107 is disposed on an inside of the gradient coil 103 and generates a radio frequency magnetic field by receiving a supply of a radio frequency (RF) pulse from the transmission circuitry 108. The transmission circuitry 108 supplies an RF pulse corresponding to Larmor frequency determined by a type of targeted atoms and magnetic field intensities, to the transmission coil 107.

The reception coil 109 is disposed on an inside of the gradient coil 103 and receives magnetic resonance signals (hereinafter, "MR signals", as necessary) emitted from the subject P subjected to an influence of a radio frequency magnetic field. Upon reception of magnetic resonance signals, the reception coil 109 outputs the received magnetic resonance signals to the reception circuitry 110.

The transmission coil 107 and the reception coil 109 described above are mere examples. The configuration thereof may be realized by selecting one of the following or combining together two or more of the following: a coil having only a transmission function; a coil having only a reception function; and a coil having transmission and reception functions.

The reception circuitry 110 detects the magnetic resonance signals output from the reception coil 109 and generates magnetic resonance data based on the detected magnetic resonance signals. More specifically, the reception circuitry 110 generates the magnetic resonance data by applying a digital conversion to the magnetic resonance signals output from the reception coil 109. Further, the reception circuitry 110 transmits the generated magnetic resonance data to the sequence control circuitry 120. The reception circuitry 110 may be provided on a gantry device side where the static magnetic field magnet 101, the gradient coil 103, and the like are provided.

The sequence control circuitry 120 images the subject P, by driving the gradient magnetic field power supply 104, the transmission circuitry 108, and the reception circuitry 110, on the basis of sequence information transmitted from the computer 130. The sequence information is information that defines a procedure of the imaging. The sequence information defines: an intensity of electric current to be supplied from the gradient magnetic field power supply 104 to the gradient coil 103 and a timing with which electric current is to be supplied; an intensity of an RF pulse to be supplied by the transmission circuitry 108 to the transmission coil 107 and the timing with which an RF pulse is to be applied; a timing with which magnetic resonance signals are to be detected by the reception circuitry 110, and the like. The sequence control circuitry 120 may be configured with an integrated circuit such as an Application Specific Integrated Circuit (ASIC) or a Field Programmable Gate Array (FPGA) or an electronic circuit such as a Central Processing Unit (CPU) or a Micro Processing Unit (MPU).

Further, upon reception of a magnetic resonance data from the reception circuitry 110 as a result of imaging of the subject P by driving the gradient magnetic field power supply 104, the transmission circuitry 108, and the reception circuitry 110, the sequence control circuitry 120 forwards the received magnetic resonance data to the computer 130.

The computer 130 exercises overall control of the magnetic resonance imaging apparatus 100, or generates an image, and the like. The computer 130 comprises storage circuitry 132, an input device 134, a display 135 and processing circuitry 150. The processing circuitry 150 includes an interface function 131, a control function 133 and an image generation function 136.

In the first embodiment, each processing function carried out at the interface function 131, the control function 133, the image generation function 136, is stored in the storage circuitry 132 in a form of an executable program by a computer. The processing circuitry 150 is a processor realizing a function corresponding to each program by reading a program from the storage circuitry 132 and thereafter executing the program. In other words, the processing circuitry 150 in a state of having read each program has each function illustrated within the processing circuitry 150 in FIG. 1. It is noted that, in FIG. 1, it is explained that the single processing circuitry 150 realizes the processing function carried out at the interface function 131, the control function 133, or the image generation function 136. However, a plurality of independent processors may constitute the processing circuitry 150, each processor of the processing circuitry 150 executing its own program. In other words, each function described above may constitute a program and the single processing circuitry may execute each program. Alternatively, a specific function may be implemented in an independent program execution circuitry dedicated for the specific function.

Terminology "processor" used in the above explanation is meant to refer to, for example, CPU (Central Processing Unit), GPU (Graphical Processing Unit), or ASIC (Application Specific Integrated Circuit), circuitry such as programmable logic device (i.e. SPLD (Simple Programmable Logic Device), CPLD (Complex Programmable Logic Device) and FPGA (Field Programmable Gate Array). A processor reads and executes a program stored in the storage circuitry 132, thereby realizing the function.

Further, instead of being stored in the storage circuitry 132, a program may be constructed such that it is directly incorporated within circuitry of a processor. In that situation, the processor realizes a function by reading and executing the program incorporated within the circuitry. The couch control circuitry 106, the transmission circuitry 108, the reception circuitry 110 may be constructed as well, with a use of electronic circuits such as processors described above.

The processing circuitry 150 sends sequence information to the sequence control circuitry 120 by the interface function 131 and receives a magnetic resonance data from the sequence control circuitry 120. Further, upon reception of the magnetic resonance data, the processing circuitry 150 stores the received magnetic resonance data into the storage circuitry 132 by the interface function 131. When receiving the magnetic resonance data, the processing circuitry 150 having the interface function 131 stores the received magnetic resonance data in the storage circuitry 132.

The magnetic resonance data stored in the storage circuitry 132 is arranged into a k-space by the control function 133. As a result, the storage circuitry 132 stores therein a k-space data.

The storage circuitry 132 stores therein the magnetic resonance data received by the processing circuitry 150 that has the interface function 131, the k-space data arranged in the k-space by the processing circuitry 150 having the control function 133, an image data generated by the processing circuitry 150 having the image generation function 136, and the like. For example, the storage circuitry 132 is configured by using a Random Access Memory (RAM), a semiconductor memory element such as a flash memory, a hard disk, an optical disc, and the like.

The input device 134 receives various types of instructions and inputs of information from an operator. For example, the input device 134 is a pointing device such as a mouse or a trackball, a selecting device such as a mode changing switch, or an input device such as a keyboard. Under the control of the processing circuitry 150 that has the control function 133, the display 135 displays Graphical User Interface (GUI) used for receiving an input of an image taking condition and an image generated by the processing circuitry 150 that has the image generation function 136, and the like. For example, the display 135 is a display device such as a liquid crystal display device.

The processing circuitry 150 exercises overall control of the magnetic resonance imaging apparatus 100 by the control function 133 and controls image capturing processing, image generation processing, image display processing, and the like. For example, the processing circuitry 150 that has the control function 133 receives an input of the image taking condition (e.g., an image taking parameter) via the GUI and generates sequence information according to the received image taking condition. Further, the processing circuitry 150 that has the control function 133 transmits the generated sequence information to the sequence control circuitry 120.

The processing circuitry 150 reads a k-space data from the storage circuitry 132 by the image generation function 136 and generates an image through a reconstructing process such as Fourier transform on the read k-space data.

Figure 2:
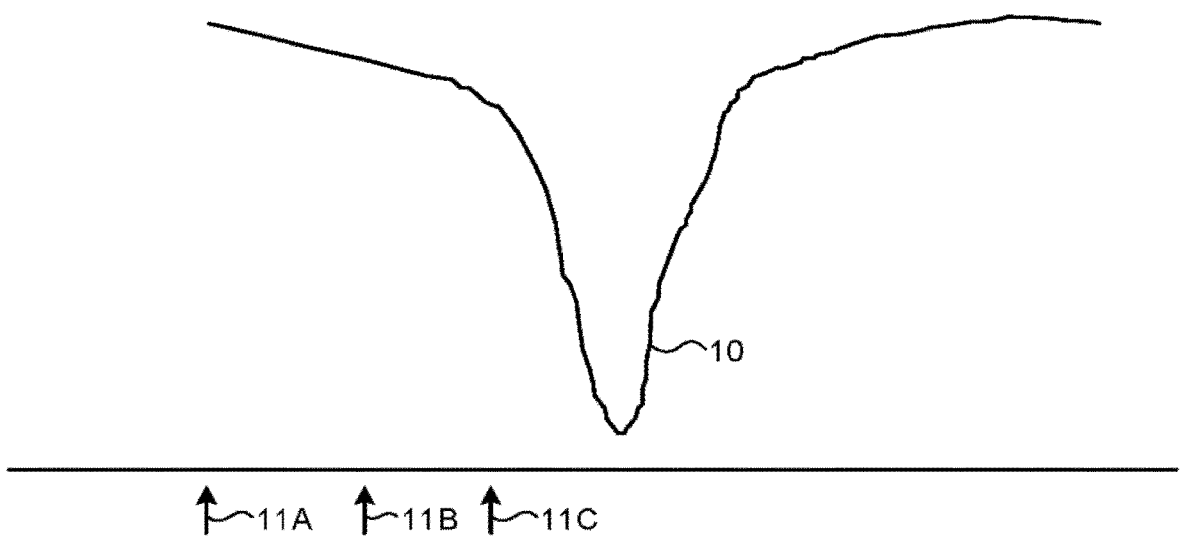
Figure 3B:
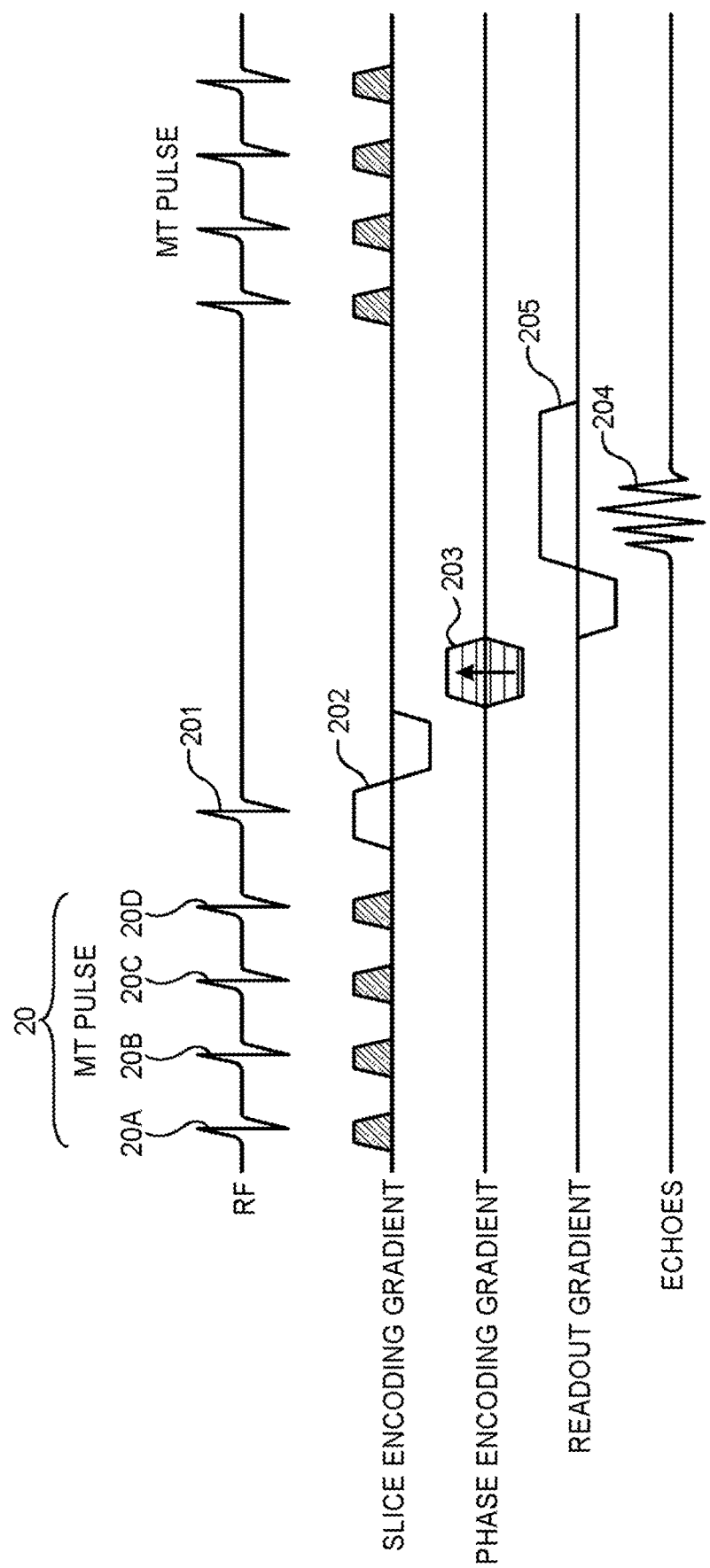
Figure 4:
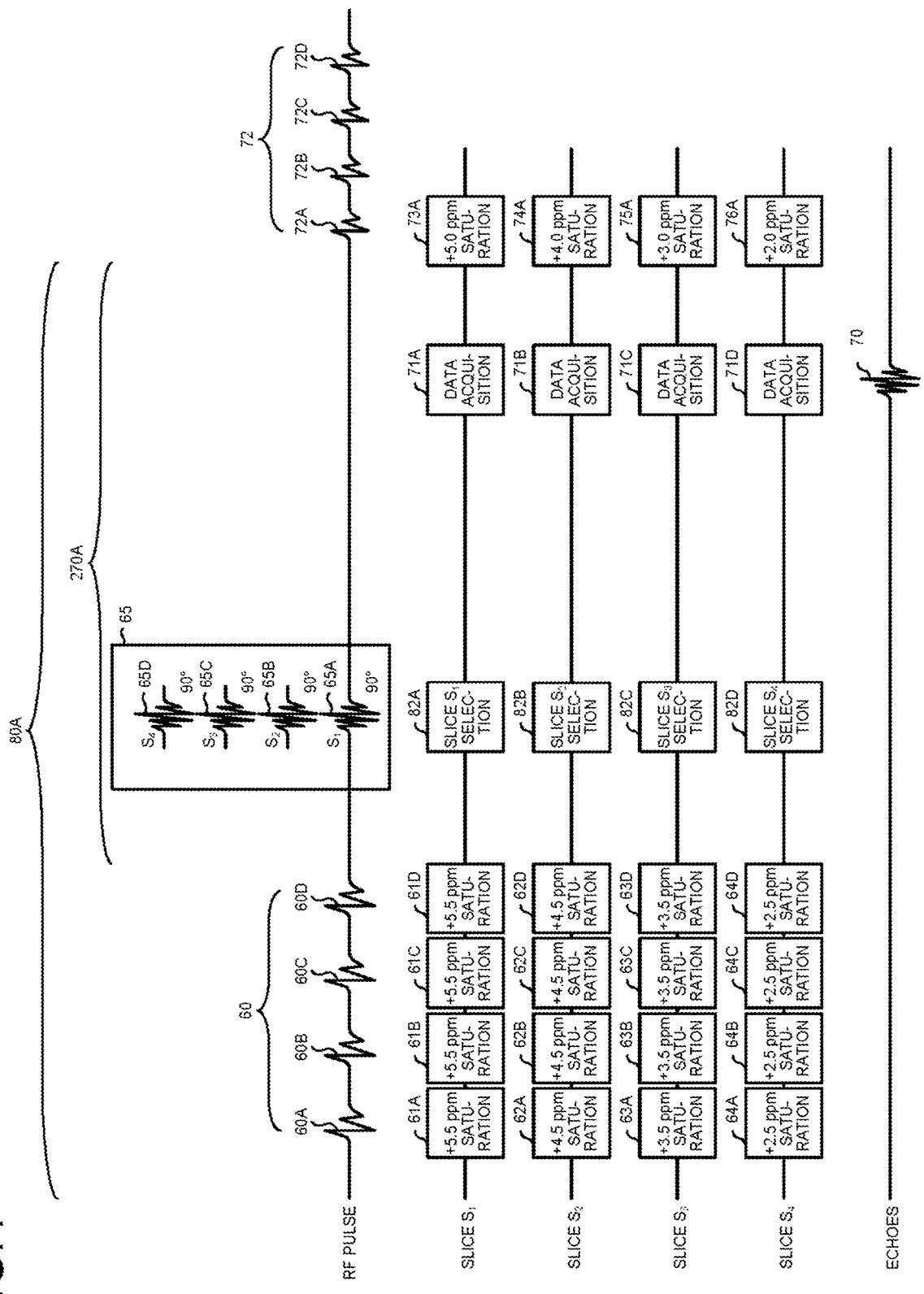
FIG. 4 is a pulse sequence diagram indicating a pulse sequence executed by a magnetic resonance imaging apparatus according to the first embodiment.
Figure 7:
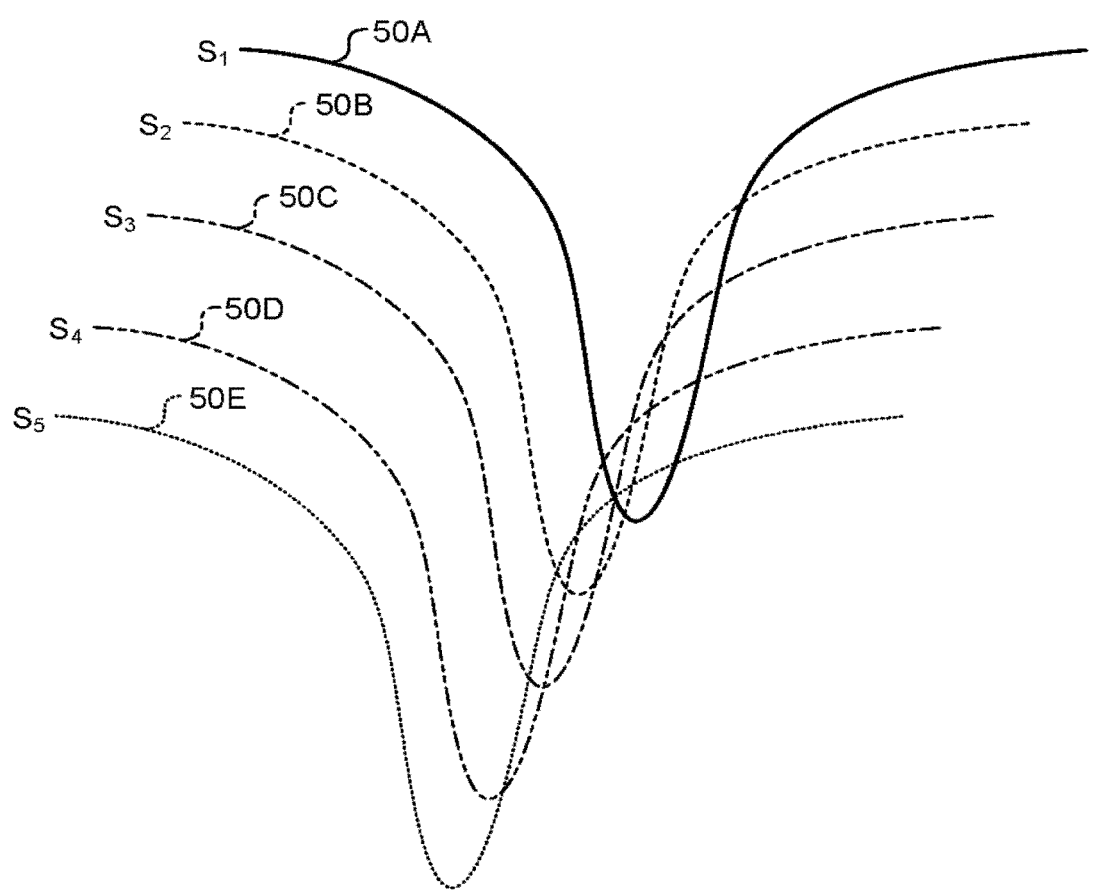
FIG. 7 is a drawing illustrating an example of data generated by a magnetic resonance imaging apparatus according to the first embodiment.

Next, the magnetic resonance imaging apparatus 100 according to the first embodiment is briefly explained with reference to FIG. 2 to FIG. 7. FIG. 2, FIG. 3A and FIG. 3B are drawings for explaining processing performed by the magnetic resonance imaging apparatus according to the first embodiment. FIG. 4 is a pulse sequence diagram indicating a pulse sequence executed by a magnetic resonance imaging apparatus according to the first embodiment. FIG. 5A, FIG. 5B, FIG. 5C, FIG. 5D, FIG. 5E, FIG. 5F and FIG. 5G are drawings for explaining a magnetic resonance imaging apparatus according to the first embodiment. FIG. 6 is a flowchart of explaining procedure of processing performed by a magnetic resonance imaging apparatus according to the first embodiment. FIG. 7 is a drawing illustrating an example of data generated by a magnetic resonance imaging apparatus according to the first embodiment.

First of all, CEST (Chemical Exchange Saturation Transfer) is briefly explained. Protons in free water (bulk water) and macromolecular protons are being exchanged with each other. For example, macromolecular protons in the amide group (—NH), the hydroxyl group (—OH), the amino group (—NH$_2$) and the like are exchangeable protons. The chemical exchange saturation transfer is a magnetic resonance imaging method utilizing the fact that protons in the amide group (—NH), the hydroxyl group (—OH), the amino group (—NH$_2$) and the like and protons in free water are being exchanged.

First of all, the sequence control circuitry 120 applies frequency selective RF (Radio Frequency) pulses (MT (Magnetization Transfer) pulses) at a frequency being away from the resonance frequency of the free water protons (off-resonance frequency) and at the same time the resonance frequency of the exchangeable protons (for example, macromolecular protons). Consequently, the exchangeable protons are saturated due to the MT pulses applied. Subsequently, the exchangeable protons are chemically exchanged with the free water protons. As a result, signals of the free water protons become saturated. Next, the sequence control circuitry 120 applies an RF pulse corresponding to the resonance frequency of the free water protons. When a predetermined time has passed, the sequence control circuitry 120 performs data acquisition. The magnetic resonance imaging apparatus 100 can image the amount of the chemical exchange between the exchangeable protons and the free water protons.

In a typical situation, the $T_2$ relaxation time of exchangeable protons in macromolecules and the like are extremely short compared to the $T_2$ relaxation time of free water protons. Therefore, it is difficult to perform magnetic resonance imaging directly using the $T_2$ relaxation time of exchangeable protons such as in macromolecules and the like (i.e. magnetization of macromolecules). On the other hand, the $T_2$ relaxation time of free water (magnetization of free water) is suitable for magnetic resonance imaging. Thus, even in a case in which imaging by directly observation of the $T_2$ relaxation time of the macromolecules is difficult, by observing magnetization of the free water protons that becomes lowered due to the chemical exchange (in the following, referred to as "the signal"), the magnetic resonance imaging apparatus can perform imaging indirectly regarding the macromolecular protons.

The CEST effect can be quantified, for example, using quantities referred to as "the Z spectrum" or "the MTRasym spectrum". The processing circuitry 150 generates the Z spectrum or the MTRasym spectrum based on data acquired by the pulse sequence executed by the sequence control circuitry 120.

The Z spectrum is a spectrum plotting signal intensity in a case in which an RF pulse corresponding to the free water protons is applied after the application of the MT pulses, as a function of the frequency of the MT pulses applied. FIG. 2 is a drawing illustrating an example of the Z spectrum. The horizontal line represents the frequency of the MT pulses applied. Further, the vertical line represents the signal value of the free water protons in a case in which an RF pulse corresponding to the free water protons is applied after the application of the MT pulses. A curve 10 represents the Z spectrum. In other words, the curve 10 represents the frequency (the frequency of the MT pulses applied) dependence of magnetization of the free water protons described above ("the signal").

In the case in which the frequency of the MT pulses applied by the sequence control circuitry 120 is equivalent to the resonance frequency of the free water protons (0 ppm), the signal becomes the lowest. An arrow 11A indicates a frequency corresponding to the resonance frequency of the amide group protons. The resonance frequency of the amide group protons are approximately 3.5 ppm. An arrow 11B indicates a frequency corresponding to the resonance frequency of the amino group protons. The resonance frequency of the amino group protons is approximately 2.0 ppm. An arrow 11C indicates a frequency corresponding to the resonance frequency of the hydroxyl group protons. The resonance frequency of the hydroxyl protons is approximately 1 ppm.

In a case in which the CEST effect does not exist, only the effect of saturation of free water protons is reflected on the Z spectrum. Consequently, the Z spectrum becomes a symmetrical spectrum as to the origin where the resonance frequency of the free water protons being the reference. On the other hand, in a case in which the CEST effect exists, the CEST effect being reflected, the Z spectrum becomes an asymmetric spectrum as to the origin where the resonance frequency of the free water protons being the reference. For example, in a case in which the frequency of the MT pulses applied by the sequence control circuitry 120 is "2 ppm", then protons in the amino group become saturated due to the MT pulses and are chemically exchanged with the free water protons. Consequently, the signal value becomes lowered. On the other hand, in a case in which the frequency of the MT pulses applied by the sequence control circuitry 120 is "−2 ppm", protons that are chemically exchangeable with the free water protons do not exist at "−2 ppm". Therefore, the signal value is not lowered.

In other words, a quantity representing the degree of asymmetry of the Z spectrum becomes a quantity that indicates the amount of the CEST effect. The MTRasym spectrum is the quantity that indicates the amount of the CEST effect.

For example, let "$S_-$" be the signal intensity in a case in which an MT pulse with the frequency of "−x ppm" is applied. Let "$S_+$" be the signal intensity in a case in which an MT pulse with the frequency of "+x ppm", that is in the opposition position, is applied. Let "$S_0$" be the signal intensity in a case in which no MT pulse is applied. The MTRasym spectrum at the frequency "x ppm" shall be obtained, for example, by the following equation: "$(S_+-S_-)/S_0$".

FIG. 3A and FIG. 3B are examples of pulse sequence diagrams illustrating examples of pulse sequences executed, in a case in which the sequence control circuitry 120 included in the magnetic resonance imaging apparatus 100 according to the first embodiment does not perform multi-slice simultaneous acquisition.

In FIG. 3A, a case is explained in which the sequence control circuitry 120 performs the imaging using a spin-echo pulse sequence.

The top row of FIG. 3A indicates RF pulses applied by the sequence control circuitry 120. A pre-sequence 20 indicates a sequence in which the sequence control circuitry 120 applies MT pulses prior to the imaging sequence. Here, the imaging sequence indicates the sequence in which the sequence control circuitry 120 performs the imaging. Each of an MT pulse 20A, an MT pulse 20B, an MT pulse 20C and an MT pulse 20D indicates MT pulses applied by the sequence control circuitry 120 during the pre-sequence 20. A 90-degrees pulse 21 indicates a 90-degrees RF pulse applied by the sequence control circuitry 120. A 180-degrees pulse 26 indicates a refocus pulse applied by the sequence control circuitry 120.

The second row of FIG. 3A indicates slice gradients applied by the sequence control circuitry 120. Each of a slice gradient 22 and a slice gradient 27 indicates a slice gradient applied with the 90-degrees pulse 21 and the 180-degrees pulse 26 (refocus pulse) by the sequence control circuitry 120, respectively.

The bottom row of FIG. 3A represents an echo that is generated. An echo 24 indicates an echo generated by the spin-echo pulse sequence.

The third row of FIG. 3A represents a phase encoding gradient applied by the sequence control circuitry 120. A phase encoding gradient 23 indicates the phase encoding gradient applied by the sequence control circuitry 120.

The fourth row of FIG. 3A represents readout gradients applied by the sequence control circuitry 120. A readout gradient 25 indicates a readout gradient applied by the sequence control circuitry 120 simultaneously with the generation of the echo 24.

The sequence control circuitry 120 applies, for example, during the pre-sequence 20, the MT pulse 20A, the MT pulse 20B, the MT pulse 20C and the MT pulse 20D. The pre-sequence 20 may include a gradient spoiler pulse applied in one or a plurality of directions of arbitrary axes (slice direction, phase encoding direction and/or readout direction). Typically, the MT pulses are applied at an off-resonance frequency away from the resonance frequency of the free water.

The sequence control circuitry 120 may apply the MT pulses in a slice selective manner. Alternatively, the sequence control circuitry 120 may apply the MT pulses in a slice non-selective manner. Each of the MT pulse 20A, the MT pulse 20B, the MT pulse 20C and the MT pulse 20D is, for example, a frequency selective RF pulse each generated by, for example, a sinc function. Further, the MT pulse 20A, the MT pulse 20B, the MT pulse 20C and the MT pulse 20D, are, for example, binomial pulses.

The CEST effect obtained by an excitation of a single frequency is relatively small. For example, in normal tissues, the effect of signal gain due to the CEST effect is, for normal tissues at a predetermined frequency, approximately two to three percent. Therefore, typically, the sequence control circuitry 120 applies a predetermined number of (e.g. twenty) MT pulses during the pre-sequence 20. It is noted that in FIG. 3A, a case in which the number of the MT pulses applied by the sequence control circuitry 120 is four. However, the number of the MT pulses to be applied is not limited to this situation.

In a case in which the sequence control circuitry 120 applies MT pulses at a frequency being away from the resonance frequency of the free water protons during the pre-sequence 20, magnetization of protons corresponding to the frequency of the MT pulse applied (for example, protons of the hydroxyl group, protons of the amide group or protons of the amino group) becomes saturated. Subsequently, the chemical exchange occurs between the protons corresponding to the frequency of the MT pulses applied and the free water protons. Consequently, as the time passes, the saturation of the magnetization moves, from the protons corresponding to the frequency of the MT pulses applied, to the free water protons. Consequently, magnetization of the free water protons becomes saturated. It is when that the sequence control circuitry 120 starts the imaging sequence.

The sequence control circuitry 120 applies the 90-degrees pulse 21 and the 180-degrees pulse 26 during the imaging sequence. Consequently, the echo 24 is generated. Further, the sequence control circuitry 120 performs a phase encoding, applying the phase encoding gradient 23. The sequence control circuitry 120 applies the readout gradient 25 during a time period in which the echo 24 is generated, thereby performing data acquisition.

Upon completion of data acquisition for one echo, the sequence control circuitry 120 repeats acquisition, changing the phase encoding gradient 23 and the frequency of the MT pulses 20A, 20B, 20C and 20D.

FIG. 3B illustrates an example of a pulse sequence in which the sequence control circuitry 120 performs data acquisition using a gradient echo.

The top row of FIG. 3B illustrates an RF pulse applied by the sequence control circuitry 120. Similarly to FIG. 3A, a pre-sequence 20 indicates a sequence in which the sequence control circuitry 120 applies MT pulses prior to the imaging sequence. Similarly to FIG. 3A, an MT pulse 20A, an MT pulse 20B, an MT pulse 20C and an MT pulse 20D indicate the MT pulses applied by the sequence control circuitry 120 during the pre-sequence 20. Further, a 90-degrees pulse 201 indicates the 90-degrees RF pulse applied by the sequence control circuitry 120.

The second row of FIG. 3B indicates slice gradients applied by the sequence control circuitry 120. A slice gradient 202 indicates a slice gradient for slice selection applied with the 90-degrees pulse 201 by the sequence control circuitry 120.

The bottom row of FIG. 3B indicates an echo that is generated. An echo 204 indicates an echo generated by the gradient echo pulse sequence.

The third row of FIG. 3B indicates a phase encoding gradient applied by the sequence control circuitry 120. A phase encoding gradient 203 indicates a phase encode gradient applied by the sequence control circuitry 120.

The fourth row of FIG. 3B indicates a readout gradient applied by the sequence control circuitry 120. A readout gradient 205 indicates a readout gradient applied by the sequence control circuitry 120. By the readout gradient 205, the echo 204 is generated.

Similarly to FIG. 3A, the sequence control circuitry 120 applies MT pulses during the pre-sequence 20. Subsequently, the sequence control circuitry 120 starts the imaging sequence.

The sequence control circuitry 120 applies, during the imaging sequence, the 90-degrees pulse 201. Further, the sequence control circuitry 120 applies the readout gradient 205. Consequently, the echo 204 is generated. The sequence control circuitry 120 applies the phase encoding gradient 203, thereby performing phase-encoding. The sequence control circuitry 120 applies the readout gradient 205 during the time period in which the echo 204 is formed, thereby performing data acquisition.

In this way, the pre-sequence 20 and the imaging sequence constitute the TR (Repetition Time), a repetition unit of a pulse sequence. In this way, upon completion of the one repetition unit, the sequence control circuitry 120 modifies the amount of phase-encoding or the frequency of the MT pulses, thereby executing the pulse sequence of the next repetition unit.

Next, with reference to FIG. 4 to FIG. 7, multi-slice acquisition performed by the magnetic resonance imaging apparatus 100 according to the first embodiment is explained. First of all, technical background of multi-slice acquisition in the CEST imaging is explained.

The CEST scan, in general, is time-consuming when it comes to imaging. For example, the CEST effect being relatively small, the sequence control circuitry 120 usually applies a plurality of MT pulses repetitively in order to perform the CEST imaging. As a result of time of the pre-sequence being prolonged, the imaging time also becomes prolonged. Further, as it takes a long time for the magnetization to move from the non-free protons to which the MT pulses are applied (i.e. protons that are other than the free water protons) to the free water protons, the sequence control circuitry 120 waits a long time since the application of the MT pulses until the start of an imaging sequence 270A. Thus, as a result of the time of the pre-sequence 20 being prolonged, the data acquisition time becomes also prolonged. Further, for example, the sequence control circuitry 120 performs acquisition of data points at a plurality of frequencies, in order to acquire the Z spectra or the MTRasym spectra. Hence, the data acquisition time is prolonged. For example, the sequence control circuitry 120 performs acquisition of data points in a plurality of frequencies ranging from −6 ppm to 6 ppm. Thus, the data acquisition time is prolonged. Further, in obtaining the Z spectra for a plurality of slices, the sequence control circuitry 120 repeats the imaging for the number of the slices times. Thus, the imaging time becomes prolonged.

In view of these backgrounds, the sequence control circuitry 120 performs multi-slice simultaneous data acquisition, thereby shortening the imaging time. The sequence control circuitry 120 performs multi-slice simultaneous data acquisition, thereby shortening the imaging time and acquiring MT effects for each slice.

In addition, as for the multi-slice simultaneous acquisition according to the embodiment, a further advantage can be considered. As for the MT effects for the multi-slice system, for example, when a certain slice is to be focused, it is possible to consider that contributions from effects other than the direct, single effect by the MT pulses applied by the sequence control circuitry 120 may exist. For example, it is possible to consider that MT effects influenced by the multi-slice property (e.g. an indirect contribution due to the fact that the neighboring slices are subject to the application of the MT pulses) may occur. In that situation, the CEST effect is enhanced. Therefore, it is considered that by the multi-slice simultaneous acquisition according to the embodiment, the image quality is even more improved.

In the first embodiment, a case is explained in which the sequence control circuitry 120 applies MT pulses of a single frequency and performs multi-slice data acquisition. Thus, the sequence control circuitry 120 performs, for example, simultaneous acquisition of three-slices or five-slices, instead of acquiring the CEST spectrum for each slice. Thus, the imaging time becomes shortened. On the other hand, in the second embodiment, a case is explained in which the sequence control circuitry 120 applies MT pulses in a plurality of frequencies and performs multi-slice data acquisition. Thus, the MT effect is enhanced for each slice, while data acquisition time is shortened.

With reference to FIG. 5A to FIG. 7, processing performed by the magnetic resonance imaging apparatus according to the first embodiment is explained with reference to FIG. 4. FIG. 4 is a pulse sequence diagram indicating an example of a pulse sequence executed by a magnetic resonance imaging apparatus according to the first embodiment The top row of FIG. 4 indicates RF pulses applied by the sequence control circuitry 120. The bottom row of FIG. 4 indicates an echo that is generated. Here, the sequence control circuitry 120, for example, performs multi-slice simultaneous acquisition for a slice $S_1$, a slice $S_2$, a slice $S_3$ and a slice $S_4$. Each of the second, the third, the fourth, and the fifth row of FIG. 4 indicates processing performed to the slice $S_1$, the slice $S_2$, the slice $S_3$ and the slice $S_4$, respectively.

The sequence control circuitry 120 applies an MT pulse 60A during a pre-sequence 60. Simultaneously, the sequence control circuitry 120 applies a gradient magnetic field in the slice direction. At this time, as illustrated in a square 61A, at slice $S_1$, for example, off-resonant protons of the frequency of +5.5 ppm are saturated, with the resonance frequency of the free protons at the slice $S_1$ being 0 ppm. Simultaneously, as illustrated in a square 62A, at the slice $S_2$, off-resonant protons of the frequency of +4.5 ppm are saturated, with the resonance frequency (Larmor frequency) of the free protons at the slice $S_2$ being 0 ppm. Simultaneously, as illustrated in a square 63A, at the slice $S_3$, off-resonant protons of the frequency of +3.5 ppm are saturated, with the resonance frequency (Larmor frequency) of the free protons at the slice $S_3$ being 0 ppm. Simultaneously, as illustrated in a square 64A, at the slice $S_4$, off-resonant protons of the frequency of +2.5 ppm are saturated, with the resonance frequency (Larmor frequency) of the free protons at the slice $S_4$ being 0 ppm. Further, at a slice $S_5$ (not illustrated in FIG. 4), off-resonant protons of the frequency of +1.5 ppm are saturated, with the resonance frequency (Larmor frequency) of the free protons at the slice $S_5$ being 0 ppm.

Figure 5A:
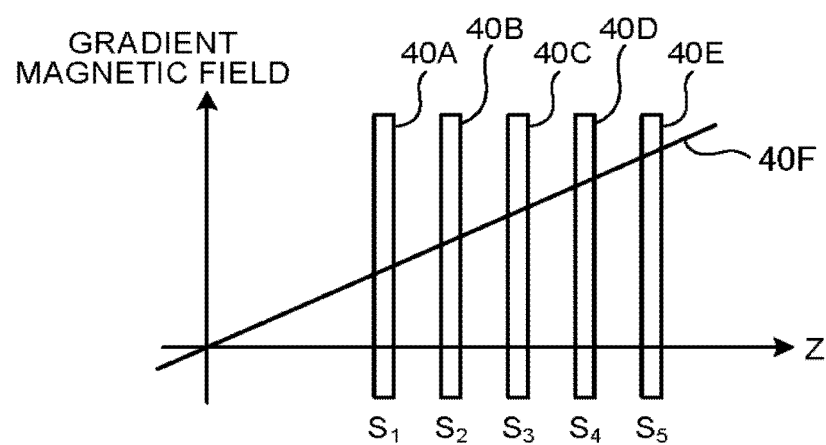

With reference to FIG. 5A to FIG. 5D, such points are explained. FIG. 5A illustrates a relation between the gradient magnetic field in the slice direction and slices, in a case in which the sequence control circuitry 120 applies the MT pulse 60A. A line 40f represents the gradient magnetic field. Here, the vertical axis represents the intensity of the gradient magnetic field. Further, the horizontal axis represents a z-axis, in other words, the position in the slice direction. Further, a slice 40A represents the slice $S_1$. Similarly, each of a slice 40B, a slice 40C, a slice 40D and a slice 40E represents the slice $S_2$, the slice $S_3$, the slice $S_4$ and the slice $S_5$, respectively. As illustrated in FIG. 5A, the intensity of the magnetic field differs depending on the slices.

Figure 5B:
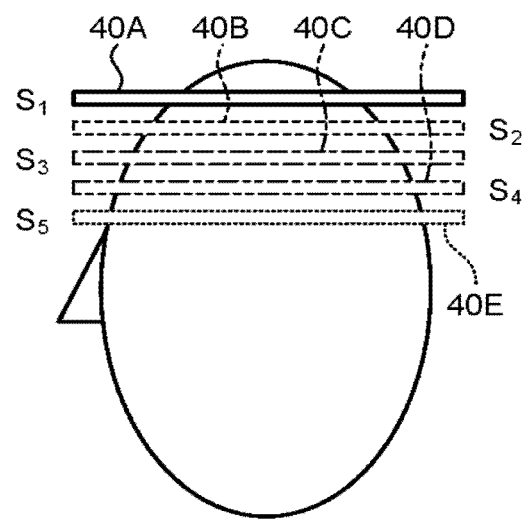

An example of a choice of the slice $S_1$ to the slice $S_5$ is illustrated in FIG. 5B. In the example of FIG. 5B, the slice $S_1$ to the slice $S_5$ are disposed on the different positions of the head part of the subject along the axial direction.

Figure 5C:
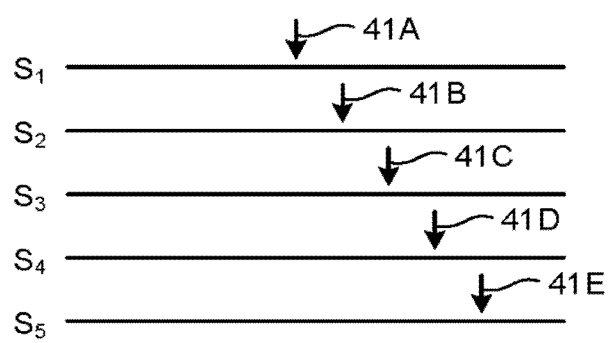

FIG. 5C illustrates resonance frequencies (Larmor frequencies) of the free water protons for each slice under such circumstance. The resonance frequency $\omega$ of the free water protons is represented by $\omega=\gamma(B_0+zG_z)$. Here, $\gamma$ is the gyromagnetic ratio. $B_0$ is the intensity of the static gradient magnetic field. z is the position in the slice direction. $G_z$ is the intensity of the slice gradient magnetic field. As can be understood from this equation, in a case in which the intensity of the slice gradient magnetic field $G_z$ is finite, the resonance frequency $\omega$ of the free water protons differs depending on the position z in the slice direction. Suppose the value of the resonance frequency of the free water protons at the slice $S_1$ can be represented by, for example, the horizontal position of an arrow 41A. At this time, the value of the resonance frequency of free water protons at the slice $S_2$ can be represented by, for example, the horizontal position of an arrow 41B. Similarly, each of the value of the resonance frequency of the free water protons at the slice $S_3$, at the slice $S_4$ and at the slice $S_5$, can be represented by the horizontal position of an arrow 41C, an arrow 41D and an arrow 41E, respectively.

Figure 5D:
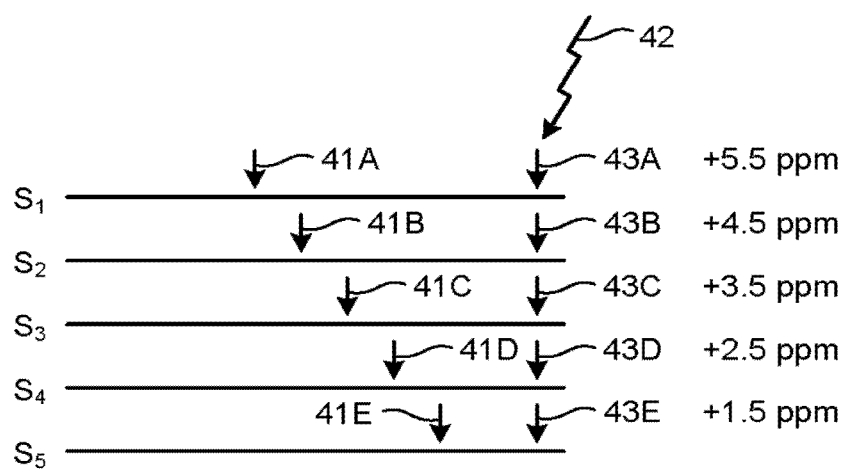

In this circumstance, FIG. 5D illustrates a case in which one fixed frequency of MT pulse is applied by the sequence control circuitry 120. The sequence control circuitry 120 applies, at a timing exemplified by the MT pulse 60A in FIG. 4, for example, an MT pulse having the frequency illustrated by an MT pulse 42, where the frequency of the MT pulse 42 is, for the slice $S_1$, indicated by the horizontal position of an arrow 43A. Further, the frequency of the MT pulse 42 is indicated by the horizontal position of an arrow 43B for the slice $S_2$. Further, similarly, the frequency of the MT pulse 42 is indicated by the horizontal position of an arrow 43C, an arrow 43D or an arrow 43E for the slice $S_3$, for the slice $S_4$ or for the slice $S_5$, respectively.

In other words, the "absolute" value of the frequency of the MT pulse 42 to be applied is the same for each slice.

However, the "relative" value of the frequency of the MT pulse 42 to be applied is different for each slice, in a case in which the resonance frequency of the free water protons in each slice is taken as the reference frequency "0 ppm". For example, the frequency of the MT pulse 42 to be applied by the sequence control circuitry 120 to the slice $S_1$ is, "5.5 ppm", as indicated by the arrow 43A, with the resonance frequency of the free water protons at the slice $S_1$ being the reference frequency "0 ppm". Further, the frequency of the MT pulse 42 to be applied by the sequence control circuitry 120 to the slice $S_2$ is, "4.5 ppm", as indicated by the arrow 43B, with the resonance frequency of the free water protons at the slice $S_2$ being the reference frequency "0 ppm". Similarly, the frequency of the MT pulse 42 to be applied by the sequence control circuitry 120 to the slice $S_3$, the slice $S_4$ and the slice $S_5$ is, "3.5 ppm", "2.5 ppm", "1.5 ppm", respectively, as indicated by the arrow 43C, the arrow 43D and the arrow 43E, with the resonance frequency of the free water protons at the slice $S_3$, the slice $S_4$ and the slice $S_5$ being the reference frequency "0 ppm". In this way, the sequence control circuitry 120 applies MT pulses over a plurality of slices under a gradient magnetic field, thereby saturating protons for different ppms, with the resonance frequency of the free water protons for each slice being the reference.

Returning to FIG. 4, the sequence control circuitry 120 repeatedly applies MT pulses during a pre-sequence 60, in the same frequency as that of the MT pulse 60A. Specifically, the sequence control circuitry 120 applies an MT pulse 60B, an MT pulse 60C and an MT pulse 60D during the pre-sequence 60.

Similarly to the MT pulse 60A, as illustrated in a square 61B, a square 62B, a square 63B and a square 64B, off-resonant protons of the frequency of +5.5 ppm, +4.5 ppm, +3.5 ppm and +2.5 ppm, respectively, are saturated at the slice $S_1$, the slice $S_2$, the slice $S_3$ and the slice $S_4$, respectively, with each resonance frequency of the free protons at the slice $S_1$, the slice $S_2$, the slice $S_3$ and the slice $S_4$, respectively, being 0 ppm. Similarly, for example, as illustrated in a square 61C, a square 62C, a square 63C and a square 64C, off-resonant protons of the frequency of +5.5 ppm, +4.5 ppm, +3.5 ppm and +2.5 ppm, respectively are saturated at the slice $S_1$, the slice $S_2$, the slice $S_3$ and the slice $S_4$, respectively, with each resonance frequency of the free protons at the slice $S_1$, the slice $S_2$, the slice $S_3$ and the slice $S_4$, respectively, being 0 ppm. Similarly, for example, as illustrated in a square 61D, a square 62D, a square 63D and a square 64D, off-resonant protons of the frequency of +5.5 ppm, +4.5 ppm, +3.5 ppm and +2.5 ppm, respectively are saturated at the slice $S_1$, the slice $S_2$, the slice $S_3$ and the slice $S_4$, respectively, with each resonance frequency of the free protons at the slice $S_1$, the slice $S_2$, the slice $S_3$ and the slice $S_4$, respectively, being 0 ppm.

Upon completion of the application of the pre-sequence 60, the sequence control circuitry 120 applies an RF pulse 65 during an imaging sequence 270A. The RF pulse 65 includes an RF pulse component 65A corresponding to the resonance frequency 41A of the free water protons at the slice $S_1$, an RF pulse component 65B corresponding to the resonance frequency 41B of the free water protons at the slice $S_2$, an RF pulse component 65C corresponding to the resonance frequency 41C of the free water protons at the slice $S_3$ and an RF pulse component 65D corresponding to the resonance frequency 41D of the free water protons at the slice $S_4$.

Subsequently, the sequence control circuitry 120 performs a predetermined sequence at the imaging sequence 270A, thereby generating an echo 70 (or a plurality of echoes). At this time, the sequence control circuitry 120, for example, performs data acquisition 71A, 71B, 71C and 71D, for each slice.

The examples of sequences which the sequence control circuitry 120 executes include FASE (Fast Asymmetric Spin Echo), EPI (Echo Planar Imaging), bSSFP (balanced Steady State Free Precession) and radial acquisition sequences.

In this way, the pre-sequence 60 combined with the imaging sequence 270A constitute the TR (Repetition Time), a repetition unit of a pulse sequence. In this way, upon completion of one repetition unit, the sequence control circuitry 120 changes the phase encoding amount or the frequency of the MT pulse, thereby executing the next repetition unit.

For example, the sequence control circuitry 120 applies an MT pulse 72A, an MT pulse 72B, an MT pulse 72C and an MT pulse 72D, during a pre-sequence 72.

This situation is illustrated, for example, in FIG. 5E. The sequence control circuitry 120 applies MT pulses of the frequency as illustrated in an MT pulse 44, for example, as exemplified by the MT pulse 72A in FIG. 4. The frequency of the MT pulse 44 is represented by an arrow 45A for the slice $S_1$. Similarly, the frequency of the MT pulse 44 is represented by an arrow 45B, an arrow 45C, an arrow 45D and an arrow 45E for the slice $S_2$, for the slice $S_3$, for the slice $S_4$ and for the slice $S_5$, respectively.

The frequency of the MT pulse 44 applied by the sequence control circuitry 120 to the slice $S_1$ is, as illustrated in the arrow 45A, "5.0 ppm", with the resonance frequency 41A of the free water protons at the slice $S_1$ being the reference frequency "0 ppm". Similarly, each of the frequencies of the MT pulse 44 applied by the sequence control circuitry 120 to the slice $S_2$, to the slice $S_3$, to the slice $S_4$ and to the slice $S_5$ is, as illustrated in the arrow 45B, the arrow 45C, the arrow 45D and the arrow 45E, respectively, "4.0 ppm", "3.0 ppm", "2.0 ppm", "1.0 ppm", respectively, with the resonance frequency 41A of the free water protons at the slice $S_2$, at the slice $S_3$, at the slice $S_4$ and at the slice $S_5$, respectively being the reference frequency "0 ppm".

Returning to FIG. 4, for example, as illustrated in a square 73A, at the slice $S_1$, off-resonant protons of a frequency of +5.0 ppm are saturated, with the resonance frequency of the free protons at the slice $S_1$ being 0 ppm. Similarly, as illustrated in a square 74A, a square 75A and a square 76A, off-resonant protons of a frequency of 4.0 ppm, +3.0 ppm and +2.0 ppm, respectively, are saturated at the slice $S_2$, the slice $S_3$, the slice $S_4$ with the resonance frequency of free protons at the slice $S_2$, the slice $S_3$ and the slice $S_4$, respectively, being 0 ppm.

The sequence control circuitry 120 performs the similar processing, thereby performing data acquisition of +5.0 ppm for the slice $S_1$. Further, the sequence control circuitry 120 performs data acquisition of +4.0 ppm, +3.0 ppm and +2.0 ppm for the slice $S_2$, the slice $S_3$ and the slice $S_4$, respectively. In this a way, one repetition period is completed.

Further, in the subsequent repetition cycle, the sequence control circuitry 120 changes the frequency of the MT pulses to be applied and applies the MT pulses. This situation is, for example, illustrated in FIG. 5F.

The sequence control circuitry 120, for example, applies MT pulses of a frequency exemplified by an MT pulse 46. Here, the frequency of the MT pulse 46 is represented by, for example, an arrow 47A for the slice $S_1$. Similarly, the frequency of the MT pulse 46 is represented by, for example, an arrow 47B, an arrow 47C, an arrow 47D and an arrow 47E for the slice $S_2$, the slice $S_3$, the slice $S_4$ and the slice $S_5$, respectively.

The frequency of the MT pulse 46 applied by the sequence control circuitry 120 to the slice $S_1$ is "4.5 ppm" as illustrated in the arrow 47A, with the resonance frequency of the free water protons at the slice $S_1$ being the reference frequency "0 ppm". Similarly, each of the frequencies of the MT pulse 46 applied by the sequence control circuitry 120 to the slice $S_2$, to the slice $S_3$, to the slice $S_4$ and to the slice $S_5$ is "3.5 ppm", "2.5 ppm", "1.5 ppm" and "0.5 ppm", respectively as illustrated in the arrow 47B, in the arrow 47C, in the arrow 47D and in the arrow 47E, respectively, with the resonance frequency 41A of the free water protons at the slice $S_2$, the slice $S_3$, the slice $S_4$ and the slice $S_5$, respectively, being the reference frequency "0 ppm".

In this way, the sequence control circuitry 120 changes the frequency of the MT pulses to be applied for each repetition cycle (in other words, TR) and repeats data acquisition. This situation is illustrated in, for example, in FIG. 5G.

In the example of FIG. 5G, a case in which the data acquisition range is −5.5 ppm to 5.5 ppm for the slice $S_1$, the slice $S_2$, the slice $S_3$, the slice $S_4$ and the slice $S_5$ is explained. The sequence control circuitry 120 performs data acquisition by applying MT pulse(s) of a first frequency as illustrated by a solid line 400 during the first repetition cycle. At this time, the sequence control circuitry 120 acquires data of +5.5 ppm in the slice $S_1$. Further, the sequence control circuitry 120 performs data acquisition of +4.5 ppm in the slice $S_2$. Similarly, the sequence control circuitry 120 performs data acquisition of +3.5 ppm, +2.5 ppm and +1.5 ppm in the slice $S_3$, in the slice $S_4$ and in the slice $S_5$, respectively.

Subsequently, the sequence control circuitry 120 performs data acquisition by applying MT pulse(s) of a second frequency that is smaller than the first frequency by 0.5 ppm, as illustrated in a solid line 401 during the second repetition cycle. At this time, the sequence control circuitry 120 acquires data of +5.0 ppm in the slice $S_1$. Further, the sequence control circuitry 120 acquires data of +4.0 ppm in the slice $S_2$. Further, the sequence control circuitry 120 acquires data of +3.0 ppm, +2.0 ppm and +1.0 ppm, in the slice $S_3$, in the slice $S_4$ and in the slice $S_5$, respectively.

Subsequently, the sequence control circuitry 120 performs data acquisition by applying MT pulse(s) of a third frequency that is smaller than the second frequency by 0.5 ppm, as illustrated in a solid line 402 during the third repetition cycle. At this time, the sequence control circuitry 120 acquires data of +4.5 ppm in the slice $S_1$. Similarly, the sequence control circuitry 120 acquires data of +3.5 ppm, +2.5 ppm, +1.5 ppm and +0.5 ppm, in the slice $S_2$, in the slice $S_3$, in the slice $S_4$ and in the slice $S_5$, respectively.

In this way, the sequence control circuitry 120 changes the frequency of the MT pulses to be applied, thereby repeatedly performs data acquisition. For example, the sequence control circuitry 120 performs data acquisition by applying MT pulses of frequencies represented by a solid line 403. At this time, the sequence control circuitry 120 performs acquisition of data of −1.5 ppm, −2.5 ppm, −3.5 ppm, −4.5 ppm and −5.5 ppm in the slice $S_1$, in the slice $S_2$, in the slice $S_3$, in the slice $S_4$ and in the slice $S_5$, respectively.

The sequence control circuitry 120 applies MT pulses of frequencies that are other than the frequencies indicated by the solid lines in FIG. 5G (e.g. of frequencies indicated by the broken lines).

For example, the sequence control circuitry 120 performs data acquisition by applying MT pulses of a frequency indicated by a broken line 404. At this time, the sequence control circuitry 120 performs acquisition of data of −2.5 ppm, −3.5 ppm, −4.5 ppm and −5.5 ppm in the slice $S_1$, in the slice $S_2$, in the slice $S_3$ and in the slice $S_4$, respectively.

Further, the sequence control circuitry 120 is capable of acquiring data of −6.5 ppm in the slice $S_5$. The sequence control circuitry may or need not acquire data of the slice $S_5$.

Further, for example, the sequence control circuitry 120 performs data acquisition by applying MT pulses of a frequency indicated by a broken line 405. At this time, the sequence control circuitry 120 performs data acquisition of +5.0 ppm, +4.0 ppm, +3.0 ppm, +2.0 ppm, in the slice $S_2$, in the slice $S_3$, in the slice $S_4$ and in the slice $S_5$, respectively. In addition, the sequence control circuitry 120 is capable of collecting data of +6.0 ppm in the slice $S_1$. The sequence control circuitry 120 may or need not collect data of the slice $S_1$.

In the example of FIG. 5G, in a case in which the multi-slice simultaneous acquisition is not performed, the sequence control circuitry 120 performs, for the frequency range of −5.5 ppm to 5.5 ppm, in the interval of 0.5 ppm for one slice, (5.5−(−5.5))/0.5+1=23 times of acquisition. Therefore, in a case in which the multi-slice simultaneous data acquisition is not performed, the sequence control circuitry 120 performs, from the slice $S_1$ to the slice $S_5$, 23*5=115 times of data acquisition in total.

On the other hand, in a case in which the multi-slice data acquisition is performed, the sequence control circuitry 120 performs acquisition of the solid lines 23−8=15 times. In addition, in a case in which the multi-slice simultaneous acquisition is performed, the sequence control circuitry 120 performs acquisition of the broken lines 16 times. Consequently, in a case in which the multi-slice data acquisition is performed, the sequence control circuitry 120 performs 15+16=23+8=31 times of acquisition in total. Therefore, the sequence control circuitry 120 can eliminate the number of data acquisition in a case in which the multi-slice simultaneous acquisition is performed.

Further, for example, from the frequency range from −10 ppm to 10 ppm, in a case in which acquisition is performed in an interval of 0.5 ppm for one slice, in a case in which the multi-slice simultaneous acquisition is not performed, the sequence control circuitry 120 performs 41 times of acquisition for one slice. Therefore, in a case in which the multi-slice simultaneous acquisition is not performed, the sequence control circuitry 120 performs 41*5=205 times of acquisition in total from the slice $S_1$ to the slice $S_5$.

On the other hand, in a case in which the multi-slice simultaneous acquisition is performed, the sequence control circuitry 120 performs acquisition of the solid line 41−8=33 times. Further, in a case in which the multi-slice simultaneous data acquisition is performed, the sequence control circuitry 120 performs acquisition of the broken lines 16 times. Therefore, in a case in which the multi-slice simultaneous data acquisition is performed, the sequence control circuitry 120 performs 33+16=41+8=49 times of data acquisition in total. Therefore, the sequence control circuitry 120 may decrease the number of acquisition in a case in which the multi-slice simultaneous data acquisition is performed.

FIG. 6 is a flowchart of explaining procedure of processing performed by a magnetic resonance imaging apparatus according to the first embodiment.

The sequence control circuitry 120 decreases the frequency of the MT pulses by a predetermined amount of ppm for each acquisition, for example from +5.5 ppm to −5.5 ppm and executes the pulse sequence that is illustrated in FIG. 4 in the frequency of MT pulses that are illustrated in the solid lines of FIG. 5G. Here, the predetermined amount of ppm is, for example, 1 ppm. Further, although not illustrated in the flowchart in order to avoid redundancy, if necessary, the sequence control circuitry 120 executes the pulse sequence that is illustrated in FIG. 4, for example, in the MT pulse frequencies as illustrated in the broken lines in FIG. 5G. As for the following procedure, a case is explained in which the sequence control circuitry 120 executes the pulse sequence illustrated in FIG. 4.

The sequence control circuitry 120, for example, as illustrated in the pre-sequence 60 illustrated in FIG. 4, in a state in which the gradient magnetic field is applied, applies the MT pulses, thereby saturating a different frequency component for each slice (Step S101). In other words, the sequence control circuitry 120 applies the MT pulses 60A to 60D over the plurality of slices $S_1$ to $S_4$ under the gradient magnetic fields. Here, "a different frequency component" indicates that the relative frequency of the frequency of the MT pulses applied is different for each slice, with the resonance frequency of the free water protons for each slice being the reference. In the first embodiment, the MT pulses 60A to 60D are MT pulses having a single frequency component.

Subsequently, the sequence control circuitry 120 applies an RF pulse corresponding to each slice while applying a slice gradient magnetic field for slice selection, as illustrated in the RF pulse 65 (Step S102). In other words, the sequence control circuitry 120 applies, for each of the plurality of slices $S_1$ to $S_4$ to which the MT pulses 60A to 60D are applied, an RF pulse of a frequency including RF pulse components 65A to 65D corresponding to the resonance frequency 41A to 41D of certain protons (the free water protons), respectively, in each of the plurality of slices $S_1$ to $S_4$.

Subsequently, the sequence control circuitry 120, for example, performs a phase encoding (Step S103). Subsequently, the sequence control circuitry 120 performs data acquisition (Step S104). The sequence control circuitry 120 repeats the Step S101 to Step S104 until the above-described termination condition is satisfied.

Subsequently, the processing circuitry 150 generates, by the image generation function 136, the Z spectrum. FIG. 7 illustrates an example of the Z spectrum generated by the processing circuitry 150 by the image generation function 136. In FIG. 7, the vertical direction indicates the intensity of the Z spectrum. The horizontal direction indicates the frequency. A curve 50A indicates the Z spectrum corresponding to the slice $S_1$. Further, each of a curve 50B, a curve 50C, a curve 50D and a curve 50E indicates the Z spectrum corresponding to the slice $S_2$, the slice $S_3$, the slice $S_4$ and the slice $S_5$, respectively. In this way, by the multi-slice simultaneous acquisition, for example, the five slices of the Z spectra are concurrently acquired. Subsequently, by the image generation function 136, the processing circuitry 150 generates the CEST effect result spectra (for example, the MTRasym spectra), based on the Z spectra generated (Step S105).

Further, in the embodiments, as for the imaging pulse sequence applied by the sequence control circuitry 120, a variety of examples can be considered. The sequence control circuitry 120 may, for example, employ a 2D (two dimensional) scan or employ a 3D (three dimensional) scan as the imaging pulse sequence. The sequence control circuitry 120 may employ, for example, a SE (Spin Echo) sequence, a FE (Field Echo) sequence, a FSE (Fast SE) sequence or the like.

Further, in the embodiment, a case is explained in which the sequence control circuitry 120 applies MT pulses in a slice selective manner. However, embodiments are not limited to this situation. For example, the sequence control circuitry 120 may apply MT pulses in a slice non-selective manner. In this case, the sequence control circuitry 120 can excite the same frequency for each slice, thereby performing multi-band acquisition. For example, the sequence control circuitry 120 may apply MT pulses in a state in which gradient magnetic fields are not applied (a state in which slices are non-selective), for example, for the slice $S_1$, the slice $S_2$, the slice $S_3$ and the slice $S_4$. In the CEST acquisition, for example, the sequence control circuitry 120 performs a plurality of times of acquisition, for example from +6 ppm to −6 ppm, with the interval of, for example, 1 ppm. The sequence control circuitry 120 applies MT pulses in a slice non-selective manner. Thus, the sequence control circuitry 120 can, at one time of the CEST frequency excitation, acquire data pertinent to the plurality of slices.

Further, embodiments are not limited to this situation. In the first embodiment, at Step S102, a case is explained in which the sequence control circuitry 120 applies an RF pulse including RF pulse components corresponding to the resonance frequency of the free water protons in each of the plurality of slices. That is, a case in which the plurality of RF pulse components is applied simultaneously. However, the sequence control circuitry 120 may apply a plurality of RF pulse components separately, with varying times little by little.

Further, a case is explained in which the sequence control circuitry 120 executes a pulse sequence by decreasing the frequency of the MT pulses by a predetermined amount of ppm for each acquisition, for example from +5.5 ppm to −5.5 ppm. However, embodiments are not limited to this situation. For example, the sequence control circuitry 120 may set the frequency of the MT pulses to be applied, for example, to be from +10 ppm to −10 ppm. Further, for example, the sequence control circuitry 120 may execute a pulse sequence by increasing the frequency of the MT pulses by 1 ppm for each acquisition, for example, form −5.5 ppm to 5.5 ppm. Alternatively, the sequence control circuitry 120 may decrease the frequency of the MT pulses by 0.5 ppm for each acquisition in a case in which the frequency of the MT pulses is not less than −5 ppm but not larger than 5 ppm and decrease the frequency of the MT pulses by 1 ppm for each acquisition in a case in which the frequency of the MT pulses is not less than −10 ppm but less than 5 ppm, or more than +5 ppm but not more than +10 ppm, thereby executing the pulse sequence from −10 ppm to +10 ppm.

As described above, in the first embodiment, the sequence control circuitry 120 may apply MT pulses of a single frequency over a plurality of slices under the gradient magnetic field. Subsequently, the sequence control circuitry 120 applies an RF pulse corresponding to the resonance frequency of the free water protons. In this way, multi-slice simultaneous acquisition can be performed and shortening of the imaging time becomes possible.

Second Embodiment

Figure 8A:
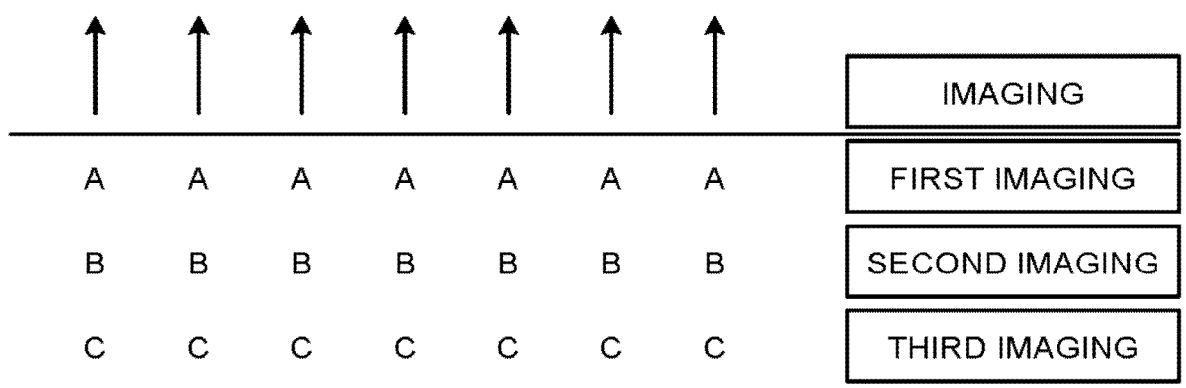
FIG. 8A and FIG. 8B are diagrams for explaining a magnetic resonance imaging apparatus according to a second embodiment.
Figure 8B:
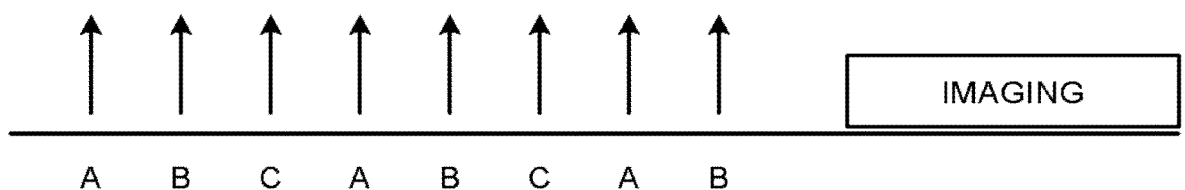
Figure 9:
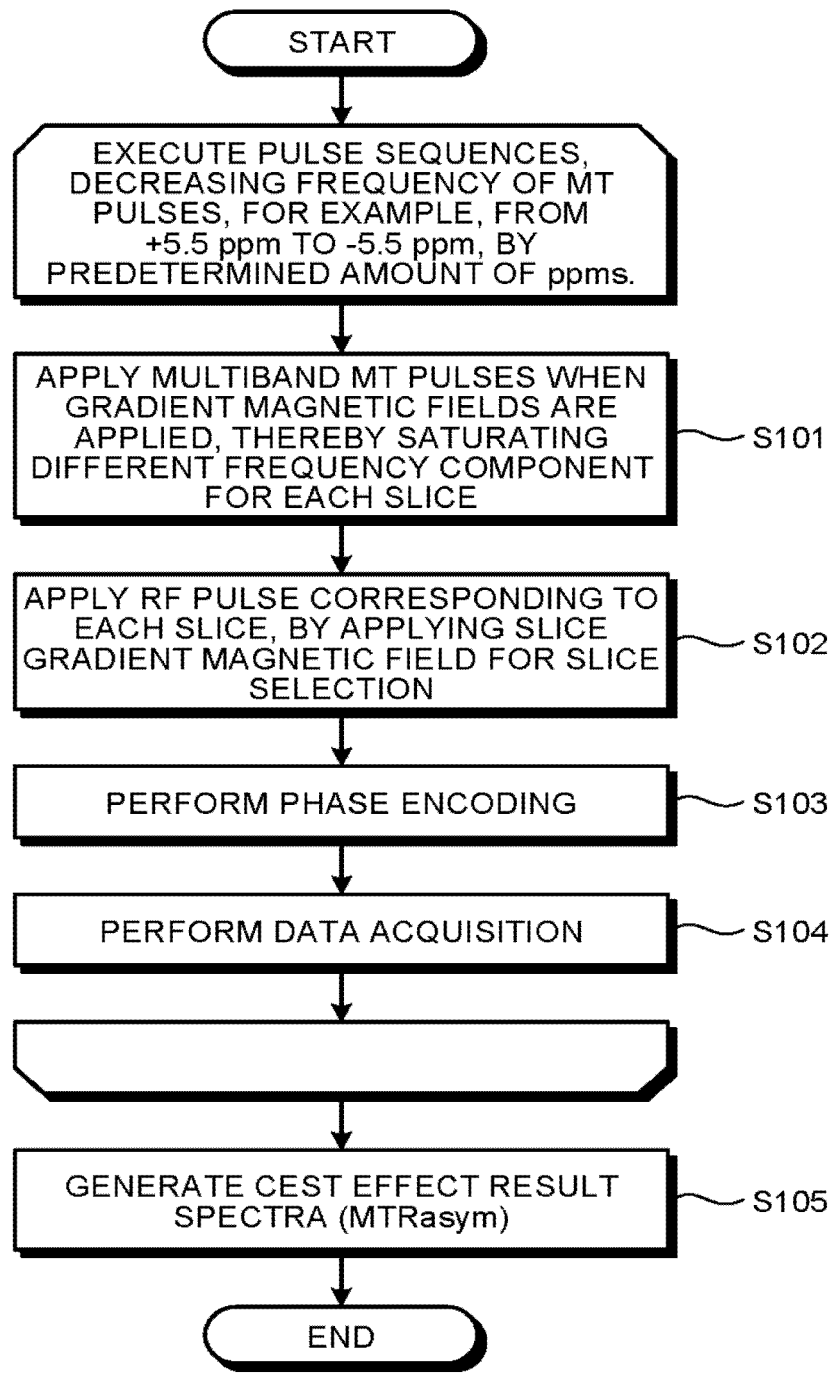
FIG. 9 is a flowchart for explaining a procedure of processing performed by a magnetic resonance imaging apparatus according to the second embodiment.

In the first embodiment, a case is explained in which the sequence control circuitry 120 performs multi-slice simultaneous acquisition by applying MT pulses in a single frequency component. In the second embodiment, with reference to FIG. 8A, FIG. 8B, FIG. 10A to FIG. 10E, a case is explained in which the sequence control circuitry 120 applies MT pulses in a plurality of frequency components. FIG. 8A and FIG. 8B are diagrams for explaining a magnetic resonance imaging apparatus according to the second embodiment. FIG. 9 is a flowchart for explaining a procedure of processing performed by a magnetic resonance imaging apparatus according to the second embodiment. FIG. 10A, FIG. 10B, FIG. 10C, FIG. 10D and FIG. 10E are drawings for explaining a magnetic resonance imaging apparatus according to the second embodiment.

In FIG. 9, as explained in the first embodiment, the sequence control circuitry 120 executes a pulse sequence, from +5.5 ppm to −5.5 ppm, for example by decreasing 0.5 ppm by each acquisition. The pulse sequence executed by the sequence control circuitry 120 is the same sequence as that in FIG. 4, aside from the fact that in the second embodiment the MT pulses are applied in a plurality of frequency components, contrary to the fact that in FIG. 4, MT pulses of a single frequency component is applied. Further, the sequence control circuitry 120 executes a pulse sequence according to the protocol illustrated in FIG. 5G, for example, as explained in the first embodiment.

The sequence control circuitry 120 applies multi-band MT pulses (applies MT pulses in a plurality of frequency components) in a state in which gradient magnetic fields are applied, thereby saturating a different frequency component for each slice (Step S101).

Here, as a first example of "applying MT pulses in a plurality of frequency components", the sequence control circuitry 120 may apply MT pulses having a plurality of frequency components. In this case, with the slice $S_1$ being the reference, the sequence control circuitry 120 applies, for example in FIG. 4, an MT pulse 60A, the MT pulse 60A being a composite pulse of an MT pulse having a frequency component of +3.5 ppm, an MT pulse having a frequency component of +2.0 ppm and an MT pulse having a frequency component of +1.0 ppm. Further, the sequence control circuitry 120 applies an MT pulse 60B that is the similar pulse as the MT pulse 60A. Similarly, the sequence control circuitry 120 applies an MT pulse 60C and an MT pulse 60D that are the similar pulses as the MT pulse 60A.

As a second example of "applying MT pulses in a plurality of frequency components", the sequence control circuitry 120 may apply a plurality of MT pulses, including an MT pulse having a first frequency component and an MT pulse having a second frequency component different from the first frequency component. In this case, the sequence control circuitry 10 may apply, for example in FIG. 4, an MT pulse 60A in the frequency of +3.5 ppm, with the slice $S_1$ being the reference. Subsequently, the sequence control circuitry 120 may apply an MT pulse 60B in the frequency of +2.0 ppm, with the slice $S_1$ being the reference. Subsequently, the sequence control circuitry 120 applies an MT pulse 60C in a frequency of +1.0 ppm, with the slice $S_1$ being the reference. Subsequently, the sequence control circuitry 120 applies an MT pulse 60D in a frequency of +3.5 ppm, with the slice $S_1$ being the reference.

FIG. 8A illustrates an example of a pre-sequence applied by the sequence control circuitry 120 in the multi-slice simultaneous acquisition explained in the first embodiment. Each one of the arrows represents an MT pulse. Each of the A, B and C indicates a mutually different frequency. As explained in the first embodiment, with the resonance frequency of the free water protons being chosen as the reference, a different frequency is excited in each slice and thereafter acquisition is performed. FIG. 8B illustrates an example of a pre-sequence executed by the sequence control circuitry 120 in a case in which MT pulses are applied in a plurality of frequencies including different frequencies, as an example of the second example described above. Each of the arrows indicates an MT pulse. Each of the A, B and C indicates a different frequency. In order to make the CEST effect become larger, the sequence control circuitry 120 selects the frequencies A, B and C to be applied such that the frequencies in which the CEST effects of specific functional groups become large (e.g. A=3.5 ppm (amide group), B=2 ppm (amino group) or C=1 ppm (hydroxyl group)).

Either in the former case (a case in which an MT pulse having a plurality of frequency components are applied) or in the latter case (frequency components differ for different MT pulses), in a case in which gradient magnetic fields do not exist, the resonance frequency of the free water proton is the same for each slice. Therefore, the frequency of the same ppm is saturated for each slice, with the resonance frequency of water protons for each slice being the reference. Either in the former case or in the latter case, in a case in which gradient magnetic fields exist, the resonance frequency of the water protons is different for each slice. Therefore, a frequency having the different amount of ppm is saturated for each slice, with the resonance frequency of the water protons in each slice being the reference. In this case, each slice is subject to a complicate excitation by a plurality of frequencies.

Similarly to the first embodiment, the sequence control circuitry 120 applies an RF pulse corresponding to each slice, while applying a slice gradient magnetic field for slice selection (Step S102). An example of this RF pulse is, for example, the RF pulse 65 illustrated in FIG. 4. Subsequently, the sequence control circuitry 120 performs a phase encoding (Step S103). Subsequently, the sequence control circuitry 120 performs data acquisition (Step S104). Upon completion of data acquisition, the processing circuitry 150 generates CEST effect result spectra (for example, the MTRasym spectra)(Step S105).

FIG. 10B to FIG. 10E illustrate a relation between the frequency of the MT pulses applied and the MTRasym spectra obtained.

Figure 10A:
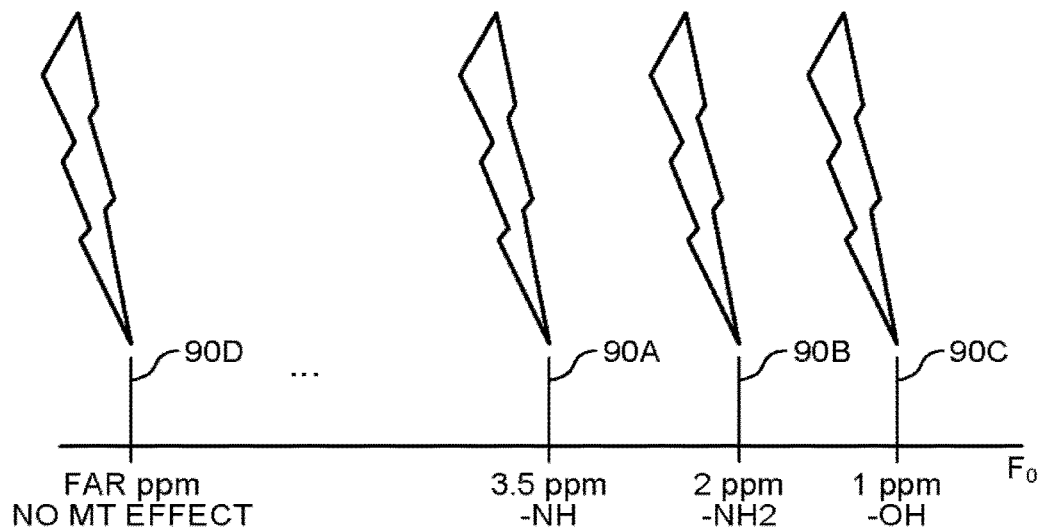
FIG. 10A, FIG. 10B, FIG. 10C, FIG. 10D and FIG. 10E are drawings for explaining a magnetic resonance imaging apparatus according to the second embodiment.

In FIG. 10A, the horizontal axis indicates a frequency in the unit of ppm. A frequency 90A indicates a frequency (3.5 ppm) corresponding to the amide group. A frequency 90B indicates a frequency (2 ppm) corresponding to the amino group. A frequency 90C indicates a frequency (1 ppm) corresponding to the hydroxyl group. A frequency 90D indicates a frequency being far away from the resonance frequency of the free water protons.

Figure 10B:
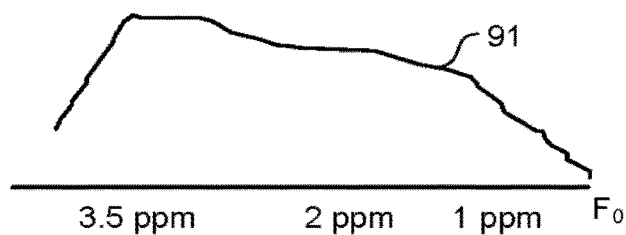

In FIG. 10B, an MTRasym spectrum 91 indicates the MTRasym spectrum in a case in which the MT pulses are applied in a frequency corresponding to the frequency 90A. The horizontal axis indicates the frequency in the unit of ppm. The MTRasym spectrum 91 has a large value in a frequency region corresponding to the amide group.

Figure 10C:
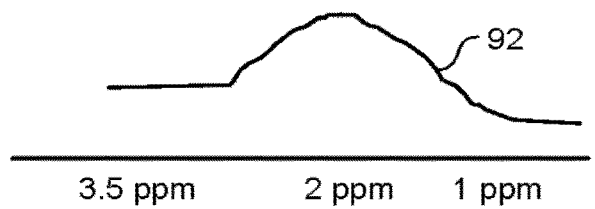

In FIG. 10C, an MTRasym spectrum 92 indicates the MTRasym spectrum in a case in which the MT pulses are applied in a frequency corresponding to the frequency 90B. The horizontal axis indicates the frequency in the unit of ppm. The MTRasym spectrum 92 has a large value in a frequency region corresponding to the amino group.

Figure 10D:
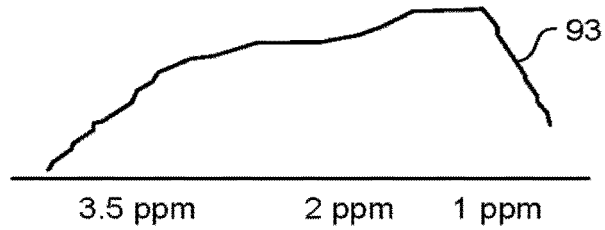

In FIG. 10D, an MTRasym spectrum 93 indicates the MTRasym spectrum in a case in which the MT pulses are applied in a frequency corresponding to the frequency 90C. The horizontal axis indicates the frequency in the unit of ppm. The MTRasym spectrum 93 has a large value in a frequency region corresponding to the hydroxyl group.

Figure 10E:
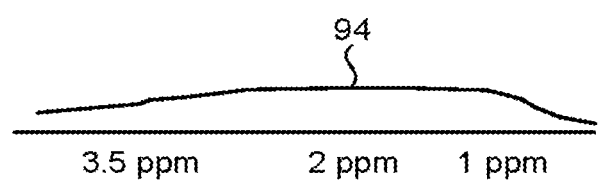

In FIG. 10E, an MTRasym spectrum 94 indicates the MTRasym spectrum in a case in which the MT pulses are applied in a frequency corresponding to the frequency 90D. The horizontal axis indicates the frequency in the unit of ppm. The MTRasym spectrum 94 has a small value over the whole frequency range.

As can be understood from FIG. 10A to FIG. 10E, when the sequence control circuitry 120 applies an MT pulse in a plurality of frequencies, in a case in which the MT pulse frequency applied are near the frequency corresponding to a specific functional group, the MTRasym spectrum has a large value. Thus, the CEST effects are enhanced.

As for the magnetic resonance imaging apparatus according to the second embodiment, the sequence control circuitry 120 applies MT pulses using a plurality of frequency components. Therefore, it is possible to enhance the CEST effects. As the CEST effects are small effects from the outset, the enhancement of the CEST effects contributes to the improvement of the image quality.

It is noted that in the second embodiment, the sequence control circuitry 120 applies MT pluses using a plurality of frequency components. Thus, each of the slices is excited in a complicated manner. However, for the purpose of generating a medical image, for example, a large contrast of an image between the normal tissues and the abnormal tissues is the essence. Compared to this, determining which frequency of the MT pulses is implicated in the large contrast of the image is sometimes of secondary importance. Thus, in the second embodiment, the sequence control circuitry 120 applies MT pulses using a plurality of frequency components, thereby increasing the CEST effect.

Third Embodiment

The third embodiment is similar to the first embodiment. However, the magnetic resonance imaging apparatus according to the third embodiment omits acquisition for data in a region in which substitution is possible and for the omitted acquisition, substitutes the calculation of the MTRasym spectrum with a specific method. In this way, the magnetic resonance imaging apparatus according to the third embodiment can further accelerate the acquisition.

Regarding this point, with reference to FIG. 10F, FIG. 11A, FIG. 11B and FIG. 11C, a further explanation is given. FIG. 10F, FIG. 11A, FIG. 11B and FIG. 11C are drawings for explaining a magnetic resonance imaging apparatus according to a third embodiment.

Figure 10F:
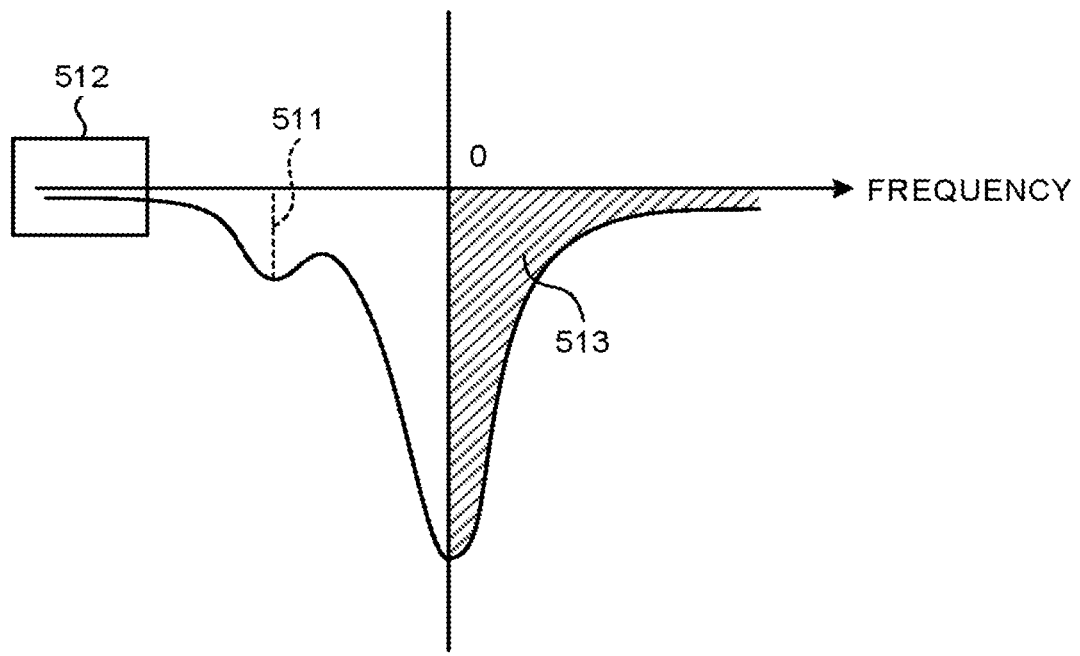
FIG. 10F, FIG. 11A, FIG. 11B and FIG. 11C are drawings for explaining a magnetic resonance imaging apparatus according to a third embodiment.

FIG. 10F illustrates a typical frequency dependence of the Z spectrum. A dotted line 511 indicates a frequency around which the CEST effect appears. When the CEST effects become large, the Z spectrum becomes an asymmetrical spectrum with the resonance frequency of free water protons being the origin. The processing circuitry 150 calculates the MTRasym spectrum of one point, based on the two Z spectra including the Z spectrum in the frequency of +x and the Z spectrum in the frequency of −x.

However, among the Z spectra necessary to calculate the MTRasym spectrum, it is often the case that one of the Z spectra becomes a spectrum of free waters in which no CEST effect appears. Consequently, it is often wasteful to perform acquisition in both of the two frequencies of the +x frequency and the −x frequency.

Therefore, in the third embodiment, the sequence control circuitry 120 executes a first pulse sequence and a second pulse sequence, the first pulse sequence applying an MT pulse of a first frequency being away from the resonance frequency of the free water protons by equal to or more than a predetermined frequency, the second pulse sequence applying a plurality of MT pulses each of which having a second frequency, each of the second frequency of the plurality of MT pulses being larger than the resonance frequency of the free water protons or each of the second frequency of the plurality of MT pulses being smaller than the resonance frequency of the free water protons.

Here, "the first frequency being away from the resonance frequency of the free water protons by equal to or more than a predetermined frequency" indicates, for example, a frequency in a region indicated by a region 512 in FIG. 10F. In other words, it is a frequency region in which the effect of the free water is negligibly small in the Z spectrum. Further, the second pulse sequence is, for example, a pulse sequence in which either of a frequency region larger than the resonance frequency of the free water protons or a frequency region smaller than the resonance frequency of the free water protons among the whole frequency regions is omitted. The second pulse sequence is a pulse sequence in which, for example, acquisition of a region 513 is omitted, for example, in FIG. 10F.

The processing circuitry 150 calculates, by the image generation function 136, a spectrum indicating the amount of the CEST (Chemical Exchange Saturation Transfer) effect based on data acquired from the first pulse sequence and data acquired from the second pulse sequence.

Here, by the image generation function 136, the processing circuitry 150 replaces the Z spectrum of the frequencies omitted during the second pulse sequence with the Z spectrum at the first frequency. For example, let us consider a case in which the first frequency is +10 ppm and during the second pulse sequence, acquisition less than 0 ppm is omitted. In this case, the MTRasym spectrum of 5 ppm is generated using the Z spectrum at a frequency of +5 ppm and the Z spectrum at a frequency of −5 ppm. Here, the processing circuitry 150 substitutes the value of the Z spectrum at a frequency of −5 ppm with the value of the Z spectrum at a frequency of +10 ppm. Therefore, the processing circuitry 150 acquires a spectrum that is similar to the MTRasym spectrum at 5 ppm. This spectrum can be construed as a spectrum representing the amount of the CEST effect. Furthermore, this spectrum is substantially halved as to the frequencies to be acquired. Thus, it is a spectrum acquired within a halved acquisition time.

Figure 11A:
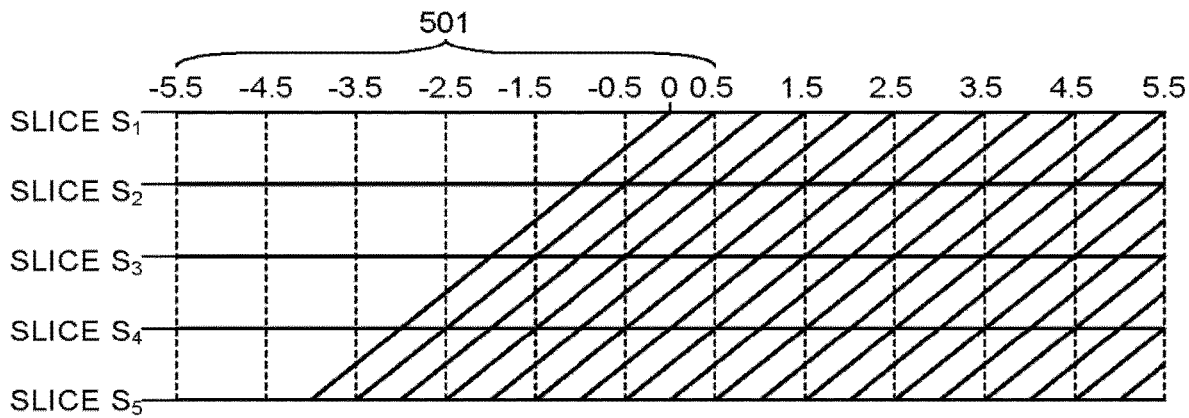
Figure 11B:
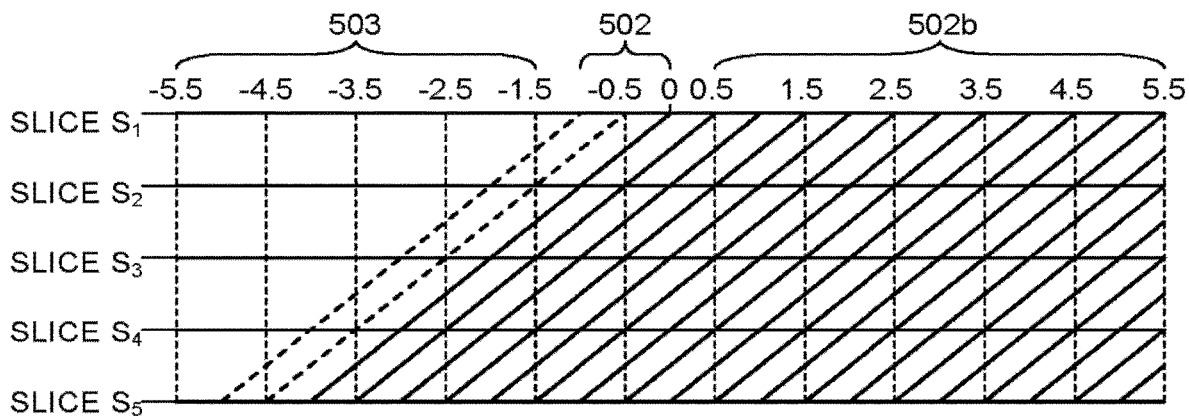
Figure 11C:
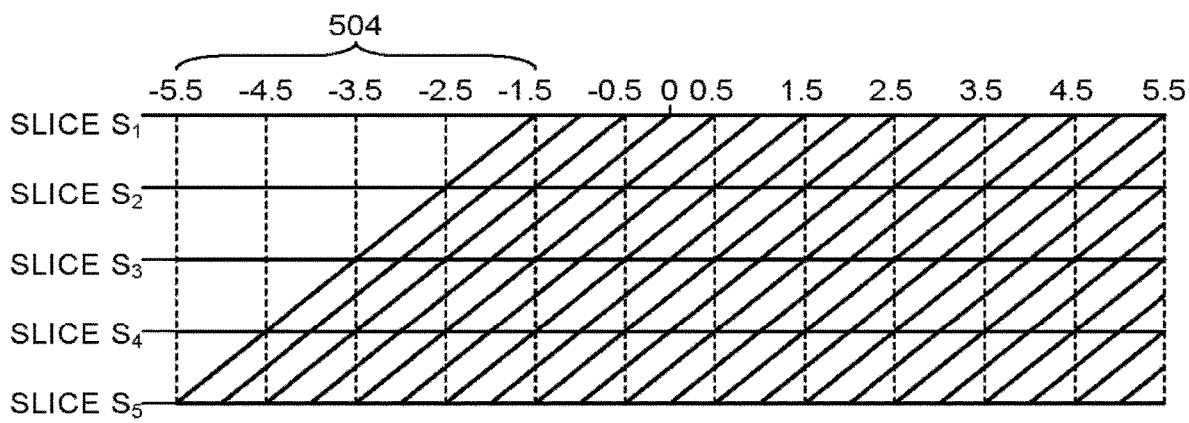

FIG. 11A to FIG. 11C illustrate some of the variations of the second pulse sequence executed by the sequence control circuitry 120 in the third embodiment.

FIG. 11A represents a case in which the frequency region of the second pulse sequence executed by the sequence control circuitry 120 in the third embodiment is not less than 0 ppm, with the slice $S_1$ being the reference. The sequence control circuitry 120 performs acquisition in a frequency region of the solid line. As for a region 501, in which no line is passing through in FIG. 11A, the sequence control circuitry 120 does not perform data acquisition. By the image generation function 136, the processing circuitry 150 substitutes the values of the Z spectrum in a region in which no data acquisition is performed by the sequence control circuitry 120 with the values of the Z spectrum acquired by the first pulse sequence. The processing circuitry 150 calculates, by the image generation function 136, the MTRasym spectrum using the substituted Z spectrum, thereby acquiring a spectrum indicating the amount of the CEST effect.

FIG. 11B represents a case in which the frequency region of the second pulse sequence executed by the sequence control circuitry 120 in the third embodiment is not less than −1 ppm, with the slice $S_1$ being the reference. The sequence control circuitry 120 performs acquisition in a frequency region of the solid line (A region 502b). Further, the sequence control circuitry 120 performs data acquisition also in the vicinity of 0 ppm, in which errors become accumulated due to the substitution of values of the Z spectrum described above, such as the frequency region indicated by the broken line (the region 502b). As for a region 503, being a region in which no line is passing through in FIG. 11B, the sequence control circuitry 120 does not perform data acquisition. By the image generation function 136, the processing circuitry 150 substitutes the values of the Z spectrum in a region in which no data acquisition is performed by the sequence control circuitry 120 with the values of the Z spectrum acquired by the first pulse sequence. The processing circuitry 150 calculates, by the image generation function 136, the MTRasym spectrum using the substituted Z spectrum, thereby acquiring a spectrum indicating the amount of the CEST effect. In the example of FIG. 11B, the sequence control circuitry 120 performs data acquisition in the vicinity of 0 ppm, in which errors becomes accumulated due to the substitution of values of the Z spectrum. In this way, shortening of an imaging time and prevention of image degradation can be coexisted.

FIG. 11C illustrates a case in which the frequency region of the second pulse sequence executed by the sequence control circuitry 120 in the third embodiment is not less than −1.5 ppm, with the slice $S_1$ being the reference. The sequence control circuitry 120 performs acquisition in a frequency region of the solid line. As for a region 504, in which no line is passing through in FIG. 11C, the sequence control circuitry 120 does not perform data acquisition. By the image generation function 136, the processing circuitry 150 substitutes the values of the Z spectrum in a region in which no data acquisition is performed by the sequence control circuitry 120 with the values of the Z spectrum acquired by the first pulse sequence. The processing circuitry 150 calculates, by the image generation function 136, the MTRasym spectrum using the substituted Z spectrum, thereby acquiring a spectrum indicating the amount of the CEST effect. In the example of FIG. 11C, the sequence control circuitry 120 omits acquisition in regions of the broken lines in FIG. 5G (in other words, a region of "less-effective frequencies" in which data cannot be acquired for all the slices at one time of acquisition). In this way, shortening of an imaging time and prevention of image degradation can be coexisted.

As describe above, the magnetic resonance imaging apparatus 100 according to the third embodiment omits acquisition for a portion of the frequency region, performs a certain processing to the omitted part, thereby acquiring a spectrum representing the amount of the CEST effects. Thus, the imaging time can be shortened.

Computer Programs

Further, the instructions presented in the processing procedures described in the above embodiments may be executed according to a computer program (hereinafter, "program") that is software. It is possible to achieve the same advantageous effects as those from the magnetic resonance imaging apparatus 100 in the above embodiments, by causing a general-purpose computer to store the program therein in advance and to read the program. The instructions described in the above embodiments are recorded as a computer-executable program onto a magnetic disk (e.g., a flexible disk, a hard disk), an optical disc (e.g., a Compact Disc Read-Only Memory [CD-ROM], a Compact Disc Recordable [CD-R], a Compact Disc Rewritable [CD-RW], a Digital Versatile Disk Read-Only Memory [DVD-ROM], a Digital Versatile Disk Recordable [DVD±R], a Digital Versatile Disk Rewritable [DVD±RW]), a semiconductor memory, or the like. Any storage format can be used, as long as a computer or an incorporated system is able to read data from the storage medium. The computer is able to realize the same operations as those performed by the magnetic resonance imaging apparatus 100 described in the above embodiments, by reading the program from the recording medium and having the CPU execute the instructions written in the program according to the read program. Further, when obtaining or reading the program, the computer may obtain or read the program via a network.

Further, according to the instructions in the program installed from the storage medium into the computer or the incorporated system, an Operating System (OS) working in the computer, middleware (MW) such as database management software or a network may execute a part of the processes performed for realizing the embodiments described above. Further, the storage medium does not necessarily have to a medium that is independent of the computer or the incorporated system. The storage medium may be such a storage medium that stores therein or temporarily stores therein the downloaded program transferred via a Local Area Network (LAN), the Internet, or the like. Further, the storage medium does not necessarily have to be one. Even the situation where the processes described in the above embodiments are executed from a plurality of media is included in possible modes of the storage medium implementing the embodiments. The medium/media may have any configuration.

Further, the computer or the incorporated system used in any of the embodiments is configured to execute the processes described in the above embodiments according to the program stored in the storage medium. The computer or the incorporated system may be configured by using a single apparatus such as a personal computer or a microcomputer or may be configured by using a system in which a plurality of apparatuses are connected together via a network. Furthermore, the computer used in any of the embodiments does not necessarily have to be a personal computer and may be an arithmetic processing apparatus, a microcomputer, or the like included in an information processing device. The term "computer" generally refers to any device or apparatus that is capable of realizing the functions described in the embodiments by using the program.

A Hardware Configuration

Figure 12:
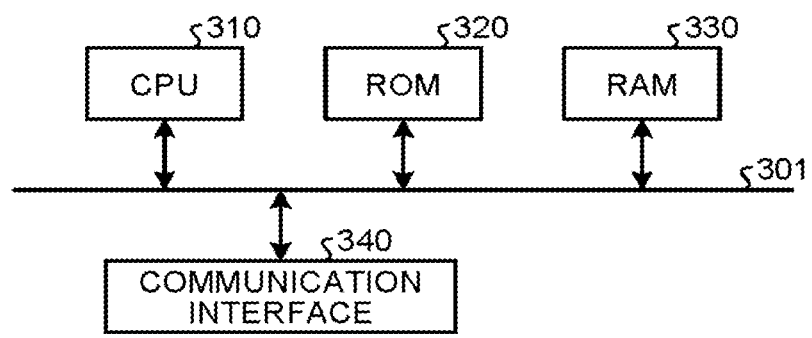
FIG. 12 is a diagram illustrating a hardware configuration of an image processing apparatus according to an embodiment.

FIG. 12 is a diagram of a hardware configuration of a computer 130 (image processing apparatus) according to an embodiment. The image processing apparatus according to the embodiments described above includes a controlling device such as a Central Processing Unit (CPU) 310, storage devices such as a Read-Only Memory (ROM) 320 and a Random Access Memory (RAM) 330, a communication interface (I/F) 340 that connects to a network and performs communication, and a bus 301 that connects the units together.

The program executed by the image processing apparatus according to the embodiments described above is provided as being incorporated, in advance, in the ROM 320 or the like. Further, the program executed by the image processing apparatus according to the embodiments described above is able to cause the computer to function as the units of the image processing apparatus described above. The computer is configured so that the CPU 310 is able to read the program from a computer-readable storage medium into a main storage device and to execute the read program.

According to a magnetic resonance imaging apparatus and a magnetic resonance imaging method according to at least one of the embodiments, it is possible to appropriately depict fluids.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising: sequence control circuitry configured to apply an MT (Magnetization Transfer) pulse over a plurality of slices under a gradient magnetic field and configured to apply, for each of the plurality of slices to which the MT pulse is applied, an RF pulse having a frequency corresponding to a resonance frequency of free water protons in each of the plurality of slices to perform multi-slice simultaneous data acquisition, wherein the sequence controlling circuitry applies the MT pulse over the plurality of slices such that each of relative values of frequencies of the MT pulse with respect to the resonance frequency of the free water protons is different for each of the plurality of slices.

2. The magnetic resonance imaging apparatus according to claim 1, wherein the MT pulse is an MT pulse having a single frequency component.

3. The magnetic resonance imaging apparatus according to claim 1, wherein the MT pulse is an MT pulse having a plurality of frequency components.

4. The magnetic resonance imaging apparatus according to claim 1, wherein the sequence control circuitry is further configured to apply a plurality of MT pulses, including an MT pulse having a first frequency component and an MT pulse having a second frequency component different from the first frequency component.

5. A magnetic resonance imaging apparatus, comprising: sequence control circuitry configured to execute a first pulse sequence and a second pulse sequence, the first pulse sequence applying an MT (Magnetization Transfer) pulse of a first frequency being away from a resonance frequency of free water protons by at least a predetermined frequency, the second pulse sequence applying a plurality of MT pulses each of which having a second frequency, each second frequency of the plurality of MT pulses being larger than the resonance frequency of the free water protons or each of the second frequency of the plurality of MT pulses being smaller than the resonance frequency of the free water protons; and processing circuitry configured to calculate an MTRasym (Magnetization Transfer Ratio Asymmetry) based on data acquired from the first pulse sequence and data acquired from the second pulse sequence, by replacing a Z spectrum of frequencies omitted during the second pulse sequence with a Z spectrum at the first frequency.

6. A magnetic resonance imaging method executed in a magnetic resonance imaging apparatus, comprising: applying an MT (Magnetization Transfer) pulse over a plurality of slices under a gradient magnetic field; and applying, for each of the plurality of slices to which the MT pulse is applied, an RF pulse having a frequency corresponding to a resonance frequency of free water protons in each of the plurality of slices to perform multi-slice simultaneous data acquisition, wherein applying the MT pulse comprises applying the MT pulse over the plurality of slices such that each of relative values of frequencies of the MT pulse with respect to the resonance frequency of the free water protons is different for each of the plurality of slices.

* * * * *